(12) United States Patent
Nishioka

(10) Patent No.: US 12,389,702 B2
(45) Date of Patent: Aug. 12, 2025

(54) SOLID-STATE IMAGING ELEMENT

(71) Applicant: SONY SEMICONDUCTOR SOLUTIONS CORPORATION, Kanagawa (JP)

(72) Inventor: Yuta Nishioka, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 452 days.

(21) Appl. No.: 17/435,286

(22) PCT Filed: Mar. 6, 2020

(86) PCT No.: PCT/JP2020/009837
§ 371 (c)(1),
(2) Date: Aug. 31, 2021

(87) PCT Pub. No.: WO2020/184478
PCT Pub. Date: Sep. 17, 2020

(65) Prior Publication Data
US 2022/0149102 A1  May 12, 2022

(30) Foreign Application Priority Data

Mar. 13, 2019 (JP) ................................ 2019-045759

(51) Int. Cl.
*H04N 5/3745* (2011.01)
*H04N 25/771* (2023.01)
*H10F 39/00* (2025.01)

(52) U.S. Cl.
CPC ......... *H10F 39/811* (2025.01); *H04N 25/771* (2023.01); *H10F 39/8057* (2025.01); *H10F 39/809* (2025.01)

(58) Field of Classification Search
CPC ......... H01L 27/14636; H01L 27/14623; H01L 27/14634; H10F 39/811; H10F 39/8057; H10F 39/809; H04N 25/771
See application file for complete search history.

(56) References Cited

U.S. PATENT DOCUMENTS 10,049,915 B2 *  8/2018  Fong ................ H01L 25/50
2015/0035109 A1 *  2/2015  Kataoka ............ H01L 24/06
257/443

(Continued)

FOREIGN PATENT DOCUMENTS

CN   105814670 A   7/2016
CN   107004672 A   8/2017

(Continued)

OTHER PUBLICATIONS

International Search Report and Written Opinion of PCT Application No. PCT/JP2020/009837, issued on Jun. 9, 2020, 09 pages of ISRWO.

*Primary Examiner* — Jarrett J Stark
(74) *Attorney, Agent, or Firm* — CHIP LAW GROUP

(57) ABSTRACT

A solid-state imaging element includes a first semiconductor substrate having a first semiconductor circuit on a first surface of the substrate, a second semiconductor substrate having a second semiconductor circuit on a second surface of the substrate, and a pixel substrate having a pixel circuit on one surface of the substrate, in which the first semiconductor substrate, the second semiconductor substrate, and the pixel substrate are joined to each other such that the first surface of the first semiconductor substrate and the second surface of the second semiconductor substrate face the one surface of the pixel substrate, and the first semiconductor circuit and the second semiconductor circuit are connected (Continued)

to each other on the first surface side and the second surface side, opposite to the side facing the pixel substrate.

13 Claims, 24 Drawing Sheets

(56)  References Cited

U.S. PATENT DOCUMENTS

| | | |
|---|---|---|
| 2017/0005128 A1 | 1/2017 | Sasaki |
| 2017/0317061 A1 | 11/2017 | Takahashi et al. |
| 2018/0114807 A1 | 4/2018 | Yamagishi et al. |
| 2018/0138225 A1* | 5/2018 | Kim .................. H01L 27/14645 |
| 2018/0240836 A1 | 8/2018 | Sasaki |
| 2020/0177829 A1* | 6/2020 | Takahashi .............. H04N 25/70 |

FOREIGN PATENT DOCUMENTS

| | | |
|---|---|---|
| JP | 2010-245506 A | 10/2010 |
| KR | 10-2016-0098221 A | 8/2016 |
| KR | 10-2017-0096102 A | 8/2017 |
| TW | 201526193 A | 7/2015 |
| TW | 201633502 A | 9/2016 |
| TW | 201637190 A | 10/2016 |
| TW | 201909440 A | 3/2019 |
| WO | 2015/093313 A1 | 6/2015 |
| WO | 2016/098691 A1 | 6/2016 |
| WO | 2016/152577 A1 | 9/2016 |
| WO | 2019/021705 A1 | 1/2019 |

* cited by examiner

FIG.15
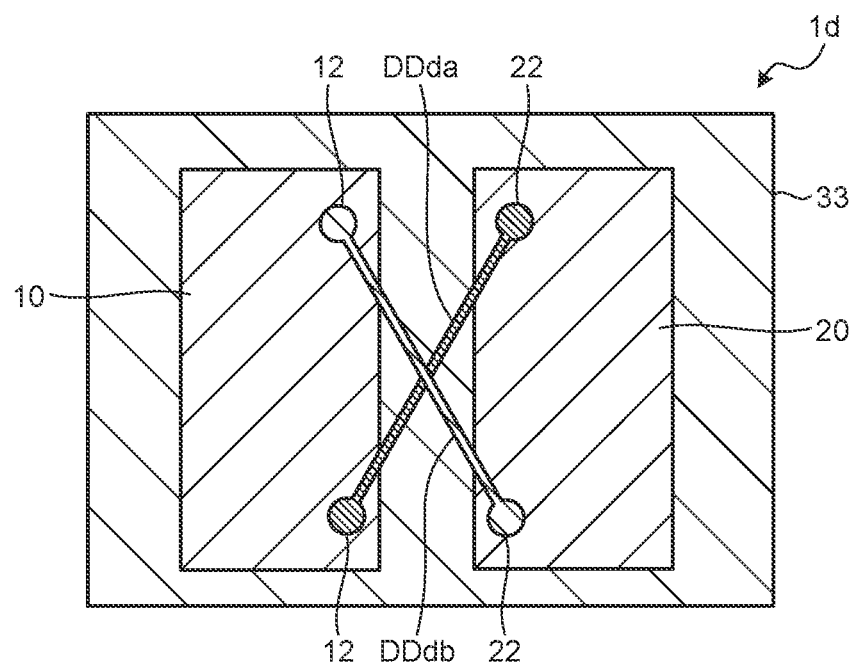
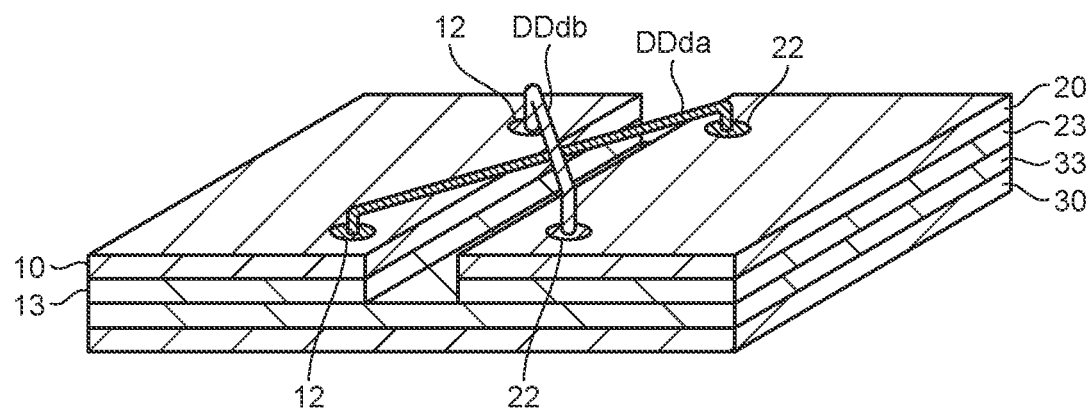

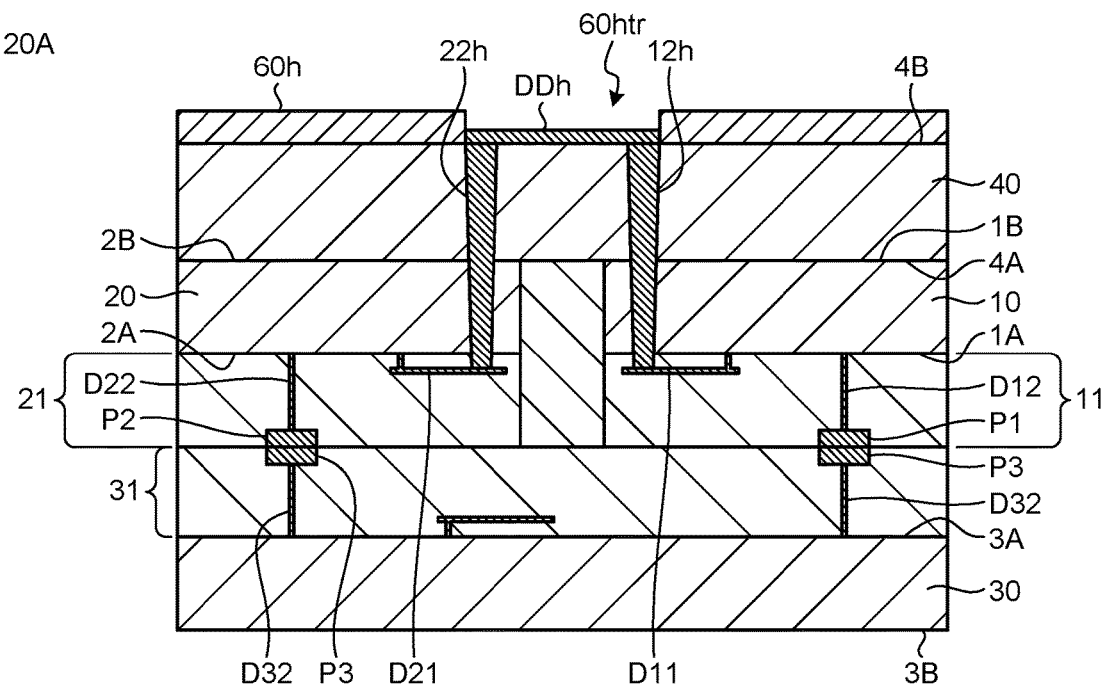
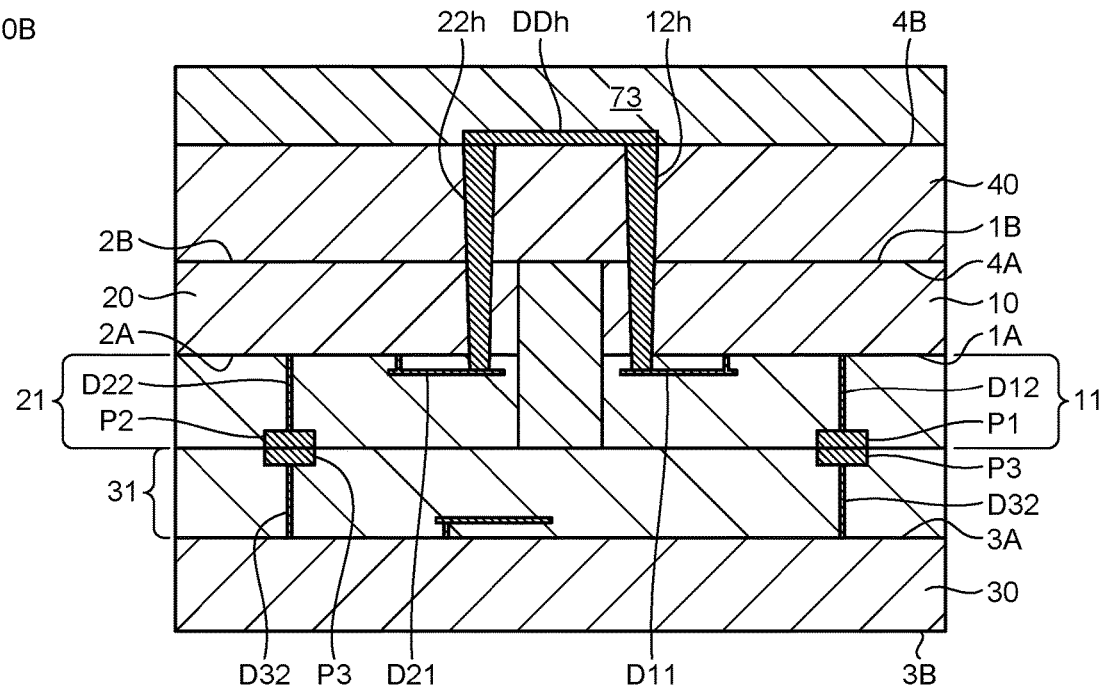

SOLID-STATE IMAGING ELEMENT

CROSS REFERENCE TO RELATED APPLICATIONS

This application is a U.S. National Phase of International Patent Application No. PCT/JP2020/009837 filed on Mar. 6, 2020, which claims priority benefit of Japanese Patent Application No. JP 2019-045759 filed in the Japan Patent Office on Mar. 13, 2019. Each of the above-referenced applications is hereby incorporated herein by reference in its entirety.

FIELD

The present disclosure relates to a solid-state imaging element.

BACKGROUND

There is a three-dimensional mounting technique of stacking a plurality of semiconductor substrates. For example, there is a known configuration of a solid-state imaging element in which a pixel substrate on which a pixel circuit is formed and a semiconductor substrate on which a semiconductor circuit such as a logic circuit is formed are stacked (refer to Patent Literature 1).

CITATION LIST

Patent Literature

Patent Literature 1: JP 2010-245506 A

SUMMARY

Technical Problem

When stacking a plurality of semiconductor substrates on a pixel substrate in the structure disclosed in Patent Literature 1, there is a concern of occurrence of a problem such as crosstalk due to a layout in which the wiring line connecting the semiconductor substrates is close to the wiring line in a pixel circuit.

Therefore, the present disclosure proposes a solid-state imaging element capable of suppressing crosstalk across wiring lines and reducing noise in a pixel substrate.

Solution to Problem

A solid-state imaging element according to the present disclosure includes: a first semiconductor substrate having a first semiconductor circuit on a first surface of the substrate; a second semiconductor substrate having a second semiconductor circuit on a second surface of the substrate; and a pixel substrate having a pixel circuit on one surface of the substrate, wherein the first semiconductor substrate, the second semiconductor substrate, and the pixel substrate are joined to each other such that the first surface of the first semiconductor substrate and the second surface of the second semiconductor substrate face the one surface of the pixel substrate, and the first semiconductor circuit and the second semiconductor circuit are connected to each other on the first surface side and the second surface side, opposite to the side facing the pixel substrate.

BRIEF DESCRIPTION OF DRAWINGS

FIG. 15 is a schematic diagram illustrating a part of a solid-state imaging element according to a fourth modification of the first embodiment of the present disclosure.

FIGS. 20A and 20B are flowcharts illustrating the example of the manufacturing process procedure of the solid-state imaging element according to the second embodiment of the present disclosure.

DESCRIPTION OF EMBODIMENTS

Embodiments of the present disclosure will be described below in detail with reference to the drawings. In each of the following embodiments, the same parts are denoted by the same reference symbols, and a repetitive description thereof will be omitted.

First Embodiment

A solid-state imaging element of a first embodiment will be described with reference to FIGS. 1A, 1B, 2A, 2B, 2C, 2D, 3A, 3B, 3C, 4A, 4B, 4C, 5A, 5B, 6A, 6B. 7. 8, 9A, 9B, 9C, 9D, 10A, 10B, 11, 12, 13A, 13B, 13C, 14A, 14B, 14C, 15, 16A, 16B, and 16C.

Configuration Example of Solid-State Imaging Element

Figure 1A:
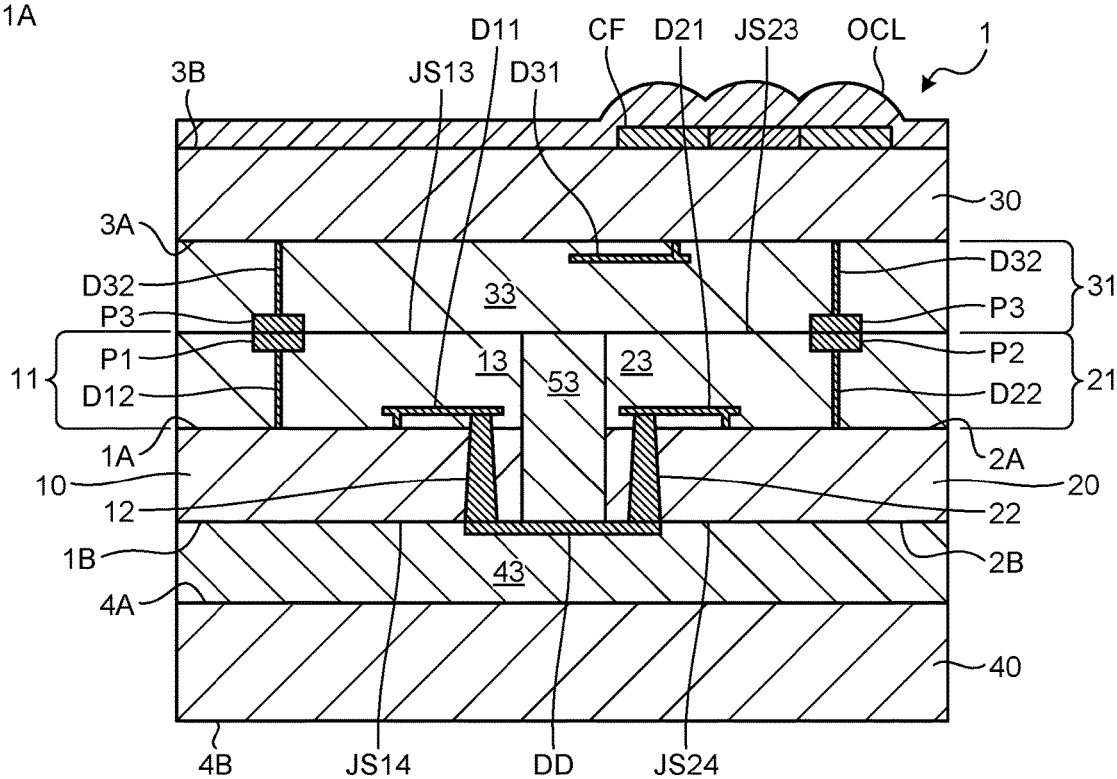
FIGS. 1A and 1B are schematic diagrams illustrating a part of a solid-state imaging element according to a first embodiment of the present disclosure.
Figure 1B:
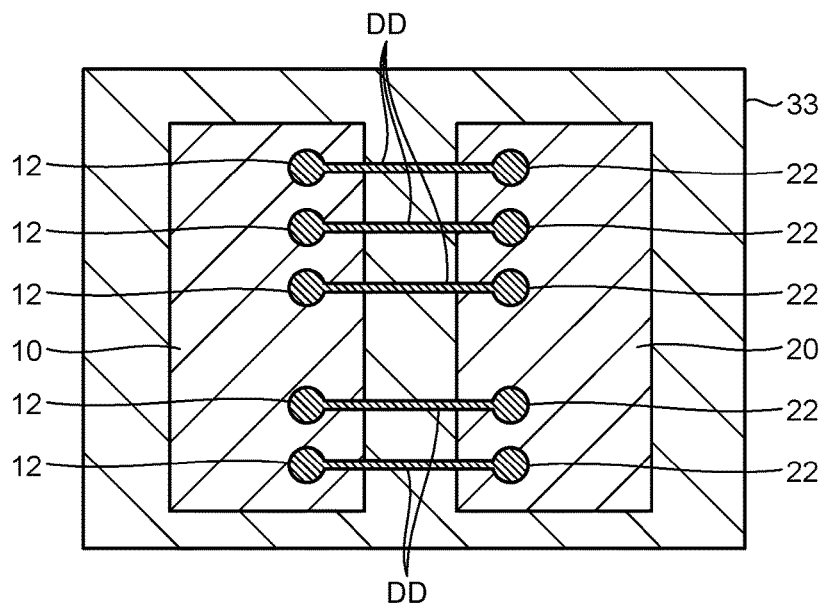

FIGS. 1A and 1B are schematic diagrams illustrating a part of a solid-state imaging element 1 according to the first embodiment of the present disclosure. FIG. 1A is a cross-sectional view illustrating a part of the solid-state imaging element 1 according to the first embodiment; FIG. 1B is a plan view illustrating the part of the solid-state imaging element 1 according to the first embodiment as viewed from a support substrate 40 side. Note that FIG. 1B omits illustration of the support substrate 40.

As illustrated in FIGS. 1A and 1B, the solid-state imaging element 1 includes a logic substrate 10 as a first semiconductor substrate, a memory substrate 20 as a second semiconductor substrate, and a pixel substrate 30. A surface 1A as a first surface of the logic substrate 10 and a surface 2A as a second surface of the memory substrate 20 are arranged to face a surface 3A as one surface of the pixel substrate 30. The logic substrate 10, the memory substrate 20, and the pixel substrate 30 are joined at joining surfaces JS13 and JS23 on their facing surface sides. The logic substrate 10 and the memory substrate 20 are further joined to the support substrate 40, on the side opposite to the side facing the pixel substrate 30. Examples of the logic substrate 10, the memory substrate 20, the pixel substrate 30, and the support substrate 40 include silicon substrates, or the like.

The pixel substrate 30 includes a pixel circuit 31 including members such as wiring lines D31 and D32, and pixel transistors (not illustrated), on the surface 3A facing the logic substrate 10 and the memory substrate 20. The pixel circuit 31 is stacked in an insulating layer 33 on the pixel substrate 30. Examples of the wiring lines D31 and D32 include Cu wiring lines, or the like. The pixel substrate 30 includes a photoelectric conversion element (not illustrated) in the substrate. The pixel substrate 30 includes a color filter CF and an on-chip lens OCL on a surface 3B opposite to the surface 3A. The on-chip lens OCL collects emitted light, and then, the collected light is guided to the photoelectric conversion element through the color filter CF. Using photoelectric conversion, the photoelectric conversion element converts the received light into an electric signal corresponding to the amount of received light. The pixel circuit 31 reads out an electric signal from the photoelectric conversion element and outputs the electric signal to the logic substrate 10 side.

The logic substrate 10 includes a logic circuit 11 as a first semiconductor circuit including wiring lines D11 and D12, a logic element (not illustrated), and the like, on the surface 1A facing a pixel substrate 30. The logic circuit 11 is stacked in the insulating layer 13 on the logic substrate 10. Examples of the wiring lines D11 and D12 include Cu wiring lines, or the like. The logic circuit 11 processes the electric signal output from the pixel substrate 30. The logic circuit 11 is electrically connected to the pixel circuit 31 through an electrode pad P3 connected to the wiring line D32 included in the pixel circuit 31 and through an electrode pad P1 connected to the wiring line D12 included in the logic circuit 11. Examples of the material of the electrode pads P1 and P3 include Cu.

The memory substrate 20 includes a memory circuit 21 as a second semiconductor circuit including wiring lines D21 and D22, a storage element (not illustrated), and the like, on the surface 2A facing the pixel substrate 30. The memory circuit 21 is stacked in an insulating layer 23 on the memory substrate 20. Examples of the wiring lines D21 and D22 include Cu wiring lines, or the like. The memory circuit 21 holds various data necessary for the solid-state imaging element 1 to function. The memory circuit 21 is electrically connected to the pixel circuit 31 through the electrode pad P3 connected to the wiring line D32 included in the pixel circuit 31 and through an electrode pad P2 connected to the wiring line D22 included in the memory circuit 21. Examples of the material of the electrode pad P2 include Cu.

The logic circuit 11 and the memory circuit 21 are connected to each other on the side of surfaces 1B and 2B, opposite to the side facing the pixel substrate 30.

More specifically, the logic substrate 10 and the memory substrate 20 are connected to each other through a via 12 as a first via penetrating the logic substrate 10, a via 22 as a second via penetrating the memory substrate 20, and a wiring line DD in a wiring layer connecting the vias 12 and 22 to each other. Examples of the material of the vias 12 and 22 and the wiring line DD include Cu. The vias 12 and 22 are Through Silicon Vias (TSVs) penetrating through the logic substrate 10 and the memory substrate 20, respectively. The vias 12 and 22 have, for example, reverse tapered shapes in which the diameter increases from the surfaces 1A and 2A side to the surfaces 1B and 2B side. As described below, a wiring layer in which the wiring line DD is disposed is a redistribution layer (RDL) formed by a plating technique, for example. The wiring line DD is arranged on the surface 1B of the logic substrate 10, the surface 2B of the memory substrate 20, and an insulating layer 53 filling the space between the logic substrate 10 and the memory substrate 20.

As illustrated in FIG. 1B, the logic substrate 10 and the memory substrate 20 may be connected to each other by a plurality of wiring lines DD. The plurality of wiring lines DD may be arranged in parallel to each other, for example.

The support substrate 40 has: a surface 4A facing the surface 1B of the logic substrate 10 and the surface 2B of the memory substrate 20; and a surface 4B on a side opposite to the surface 4A. The support substrate 40 is joined to the logic substrate 10 and the memory substrate 20 through an insulating layer 43 at joining surfaces JS14 and JS24.

Example of Process of Manufacturing Solid-State Imaging Element

Next, an example of a process of manufacturing the solid-state imaging element 1 according to the first embodiment will be described with reference to FIGS. 2A, 2B, 2C, 2D, 3A, 3B, 3C, 4A, 4B, 4C, 5A, 5B, 6A, 6B, and 7. FIGS. 2A, 2B, 2C, 2D, 3A, 3B, 3C, 4A, 4B, 4C, 5A, 5B, 6A, and 6B are flowcharts illustrating an example of a manufacturing process procedure of the solid-state imaging element 1 according to the first embodiment of the present disclosure.

Figures 2A, 2B:
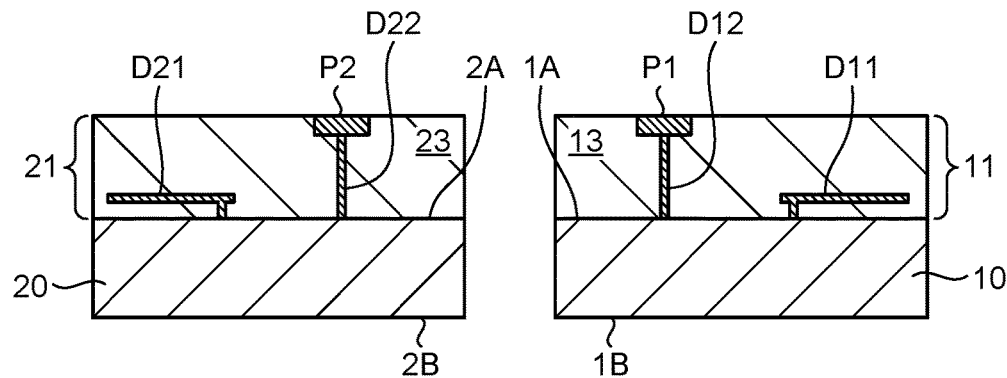
FIGS. 2A, 2B, 2C, and 2D are flowcharts illustrating an example of a manufacturing process procedure of the solid-state imaging element according to the first embodiment of the present disclosure.

As illustrated in FIG. 2A, the memory substrate 20, in which the memory circuit 21 is stacked in the insulating layer 23, is formed. After the formation of the wiring lines D21 and D22, the electrode pad P2, and the like, the memory substrate 20 is ground to be thinned.

As illustrated in FIG. 2B, the logic substrate 10, in which the logic circuit 11 is stacked in the insulating layer 13, is formed. After the formation of the wiring lines D11 and D12, the electrode pad P1, and the like, the logic substrate 10 is ground to be thinned.

Figure 2C:
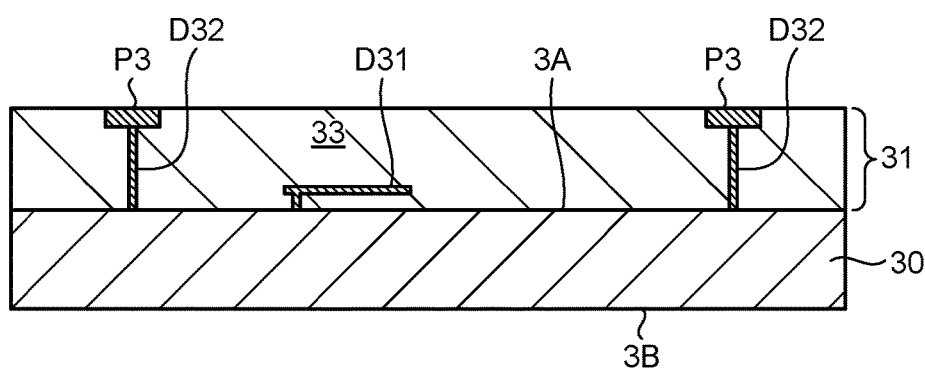

As illustrated in FIG. 2C, the pixel substrate 30, in which the pixel circuit 31 is stacked in the insulating layer 33, is formed. The pixel substrate 30 is provided with the wiring lines D31 and D32, the electrode pad P3, and the like. The pixel substrate 30 may also be ground to be thinned.

The order of formation of the logic substrate 10, the memory substrate 20, and the pixel substrate 30 is not limited.

Figure 2D:
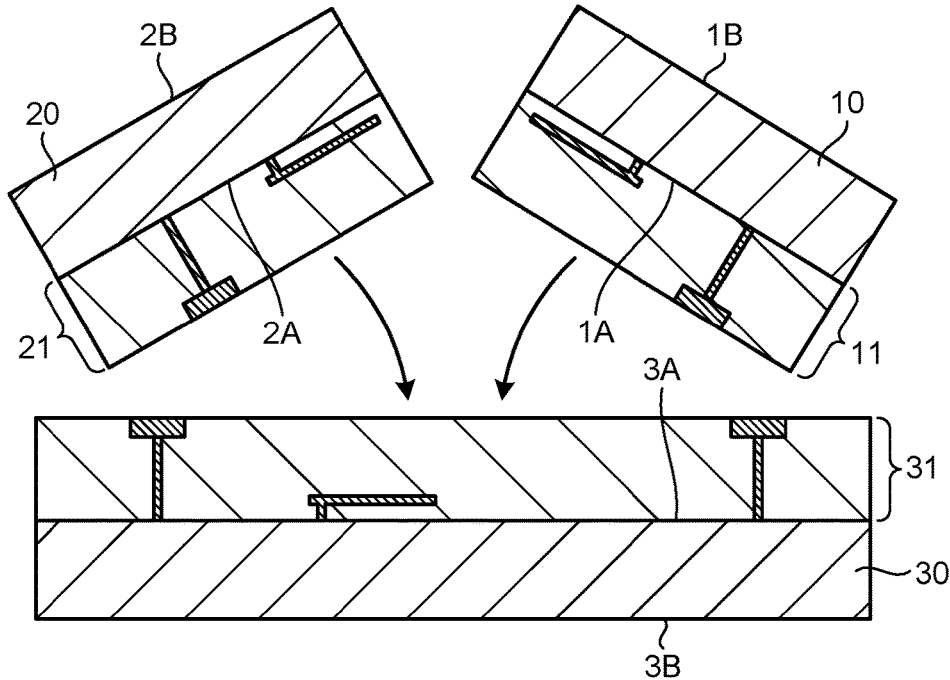

As illustrated in FIG. 2D, the logic substrate 10 and the memory substrate 20 are bonded to the pixel substrate 30 such that the surface 1A of the logic substrate 10 and the surface 2A of the memory substrate 20 face the surface 3A of the pixel substrate 30.

Figure 3A:
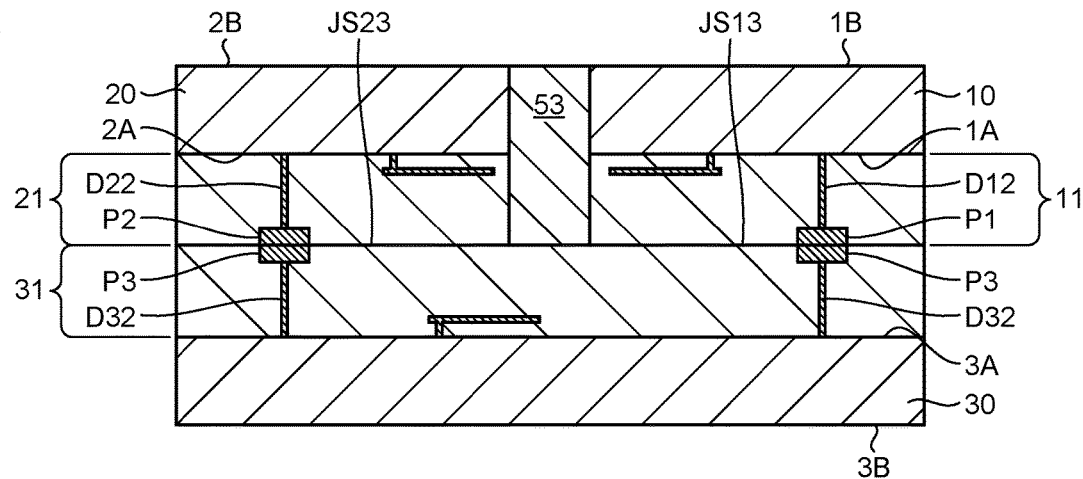
FIGS. 3A, 3B, and 3C are flowcharts illustrating the example of the manufacturing process procedure of the solid-state imaging element according to the first embodiment of the present disclosure.

As illustrated in FIG. 3A, using the procedure described above, the logic substrate 10 is joined to the pixel substrate 30 at the joining surface JS13 through the electrode pads P1 and P3. In addition, the memory substrate 20 is joined to the pixel substrate 30 at the joining surface JS23 through the electrode pads P2 and P3. The electrode pads P1 and P3 are joined to each other and the electrode pads P2 and P3 are joined to each other using Cu—Cu joining, for example.

Using a chemical vapor deposition (CVD) process, for example, the insulating layer 53 filling the space between the logic substrate 10 and the memory substrate 20 is formed, and then, the insulating layer 53 is planarized by a chemical mechanical polishing (CMP) process, for example.

Figure 3B:
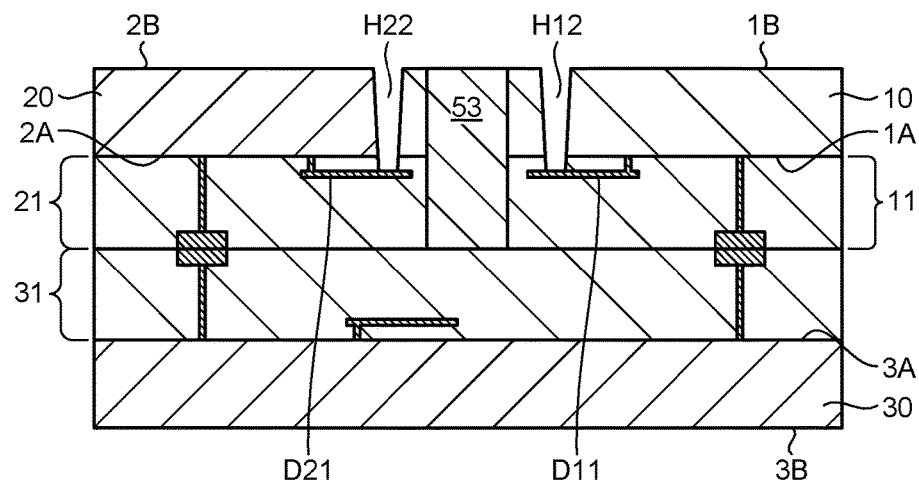

As illustrated in FIG. 3B, a through hole H12 is formed to penetrate the logic substrate 10 from the surface 1B side to reach the wiring line D11. In addition, a through hole H22 is formed to penetrate the memory substrate 20 from the surface 2B side to reach the wiring line D21. These through holes 12 and 22 tend to have a tapered shape in which the diameter decreases from the surfaces 1B and 2B side to the surfaces 1A and 2A side.

Figure 3C:
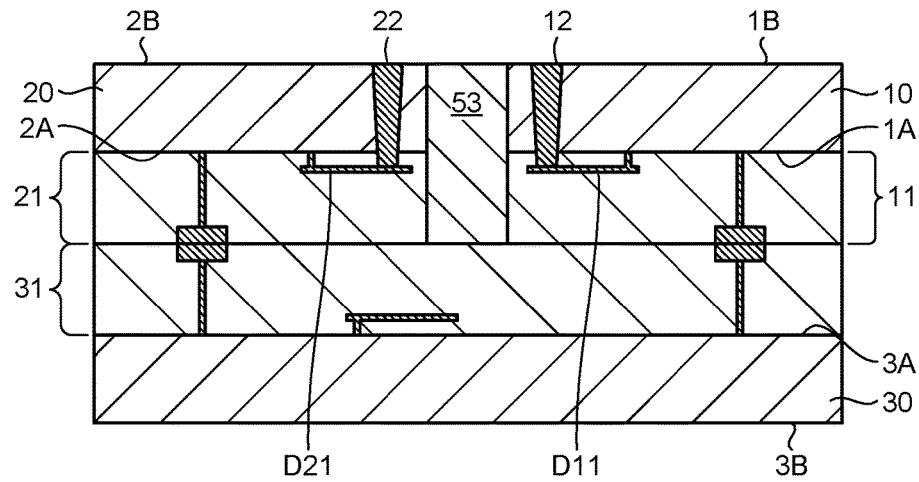

As illustrated in FIG. 3C, the through hole H12 is filled with a conductive material such as Cu to form the via 12 that penetrates the logic substrate 10 to be connected to the wiring line D11, for example. In addition, the through hole H22 is filled with a conductive material such as Cu to form the via 22 that penetrates the memory substrate 20 to be connected to the wiring line D21, for example. For example, by having a tapered shape in which the diameter decreases from the surfaces 1B and 2B side to the surfaces 1A and 2A side, the vias 12 and 22 can be determined to have been formed from the surfaces 1B and 2B side.

Figure 4A:
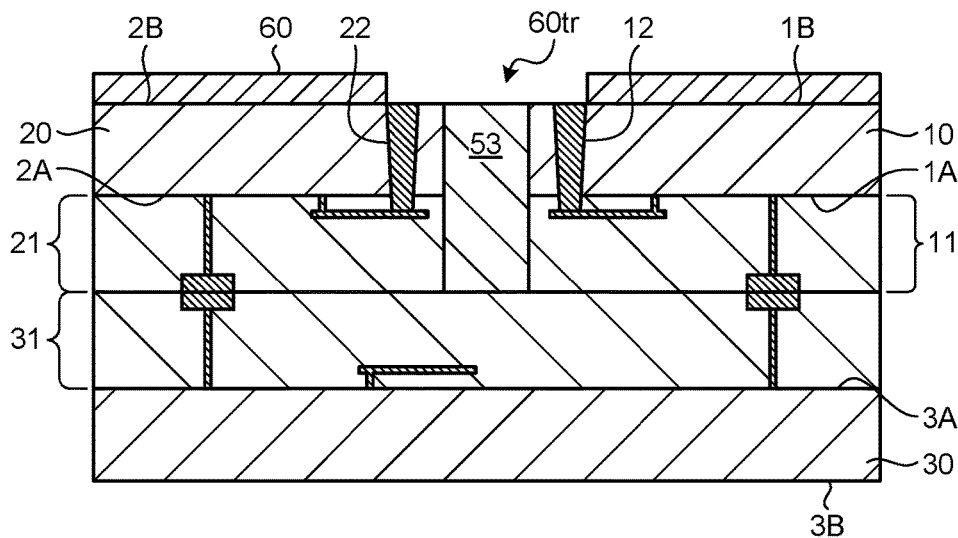
FIGS. 4A, 4B, and 4C are flowcharts illustrating the example of the manufacturing process procedure of the solid-state imaging element according to the first embodiment of the present disclosure.

As illustrated in FIG. 4A, a resin 60 is formed on the surface 1B of the logic substrate 10 and the surface 2B of the memory substrate 20. The resin 60 has a trench pattern 60tr in a region including the via 12 of the logic substrate 10 and the via 22 of the memory substrate 20.

Figure 4B:
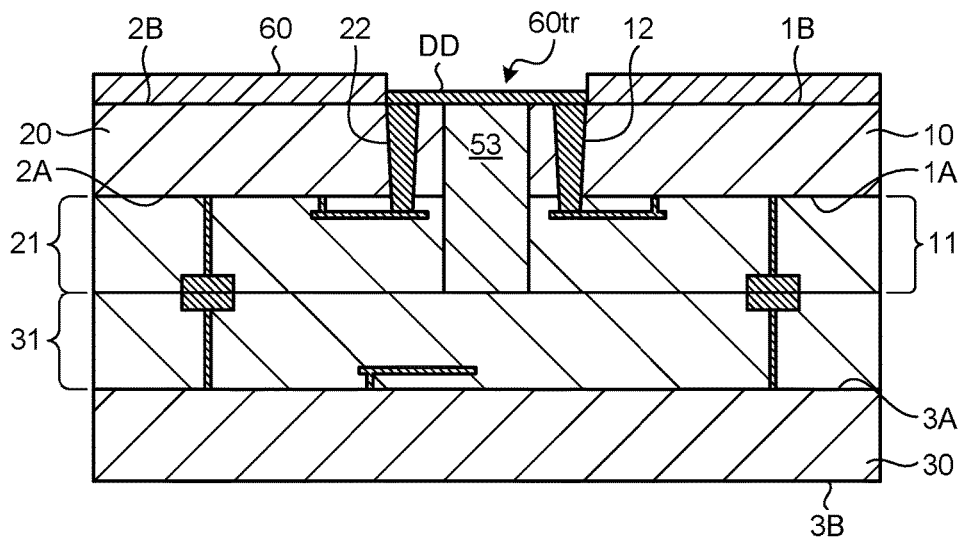

As illustrated in FIG. 4B, the trench pattern 60tr in the resin 60 is filled with a conductive material such as Cu by a plating method, for example, so as to form the wiring line DD.

Figure 4C:
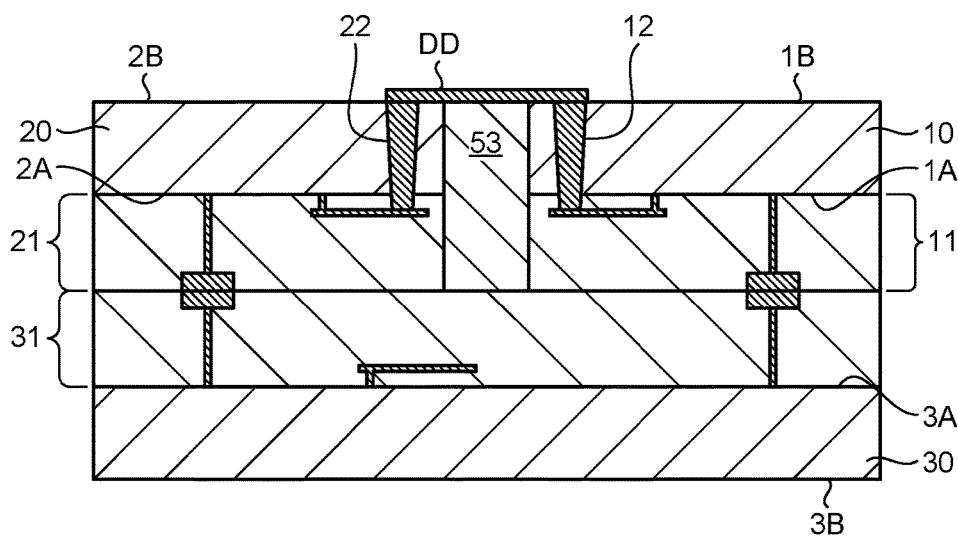

As illustrated in FIG. 4C, the resin 60 is peeled off. This forms the wiring line DD in the redistribution layer. For formation of the redistribution layer, an insulating layer having a trench pattern, or the like, can be used instead of the resin 60 having the trench pattern 60tr.

Figure 5A:
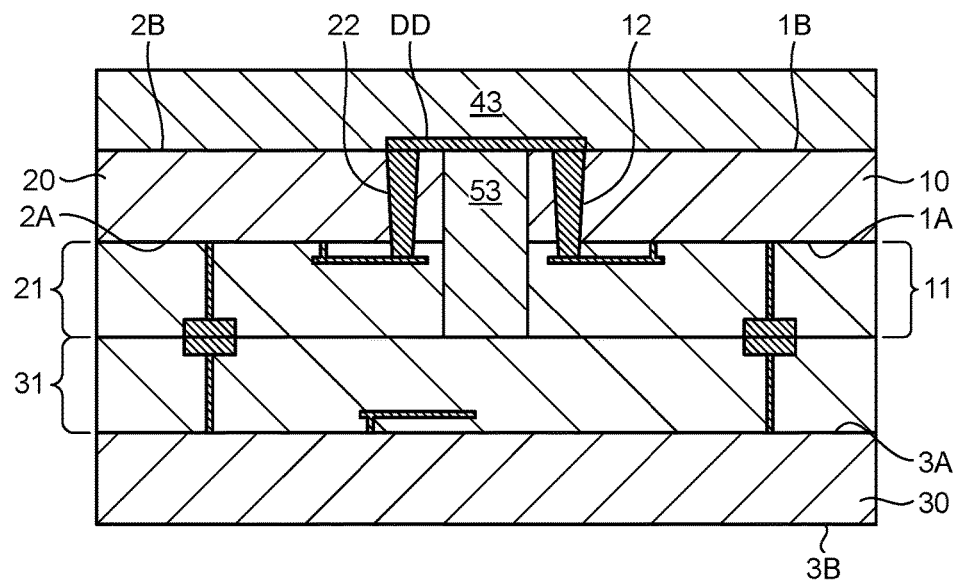
FIGS. 5A and 5B are flowcharts illustrating the example of the manufacturing process procedure of the solid-state imaging element according to the first embodiment of the present disclosure.

As illustrated in FIG. 5A, the insulating layer 43 is formed on the surface 1B of the logic substrate 10 and the surface 2B of the memory substrate 20 so as to cover the wiring line DD.

Figure 5B:
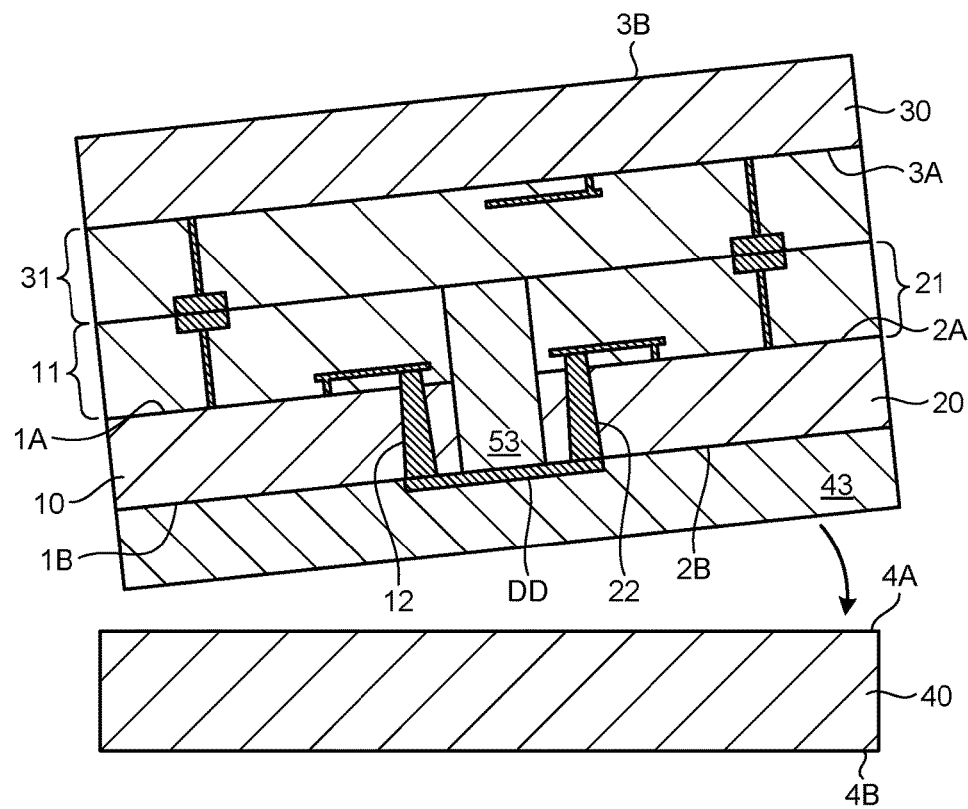

As illustrated in FIG. 5B, the logic substrate 10 and the memory substrate 20 are bonded to the support substrate 40 such that the surface 1B of the logic substrate 10 and the surface 2B of the memory substrate 20 face the surface 4A of the support substrate 40.

Figure 6A:
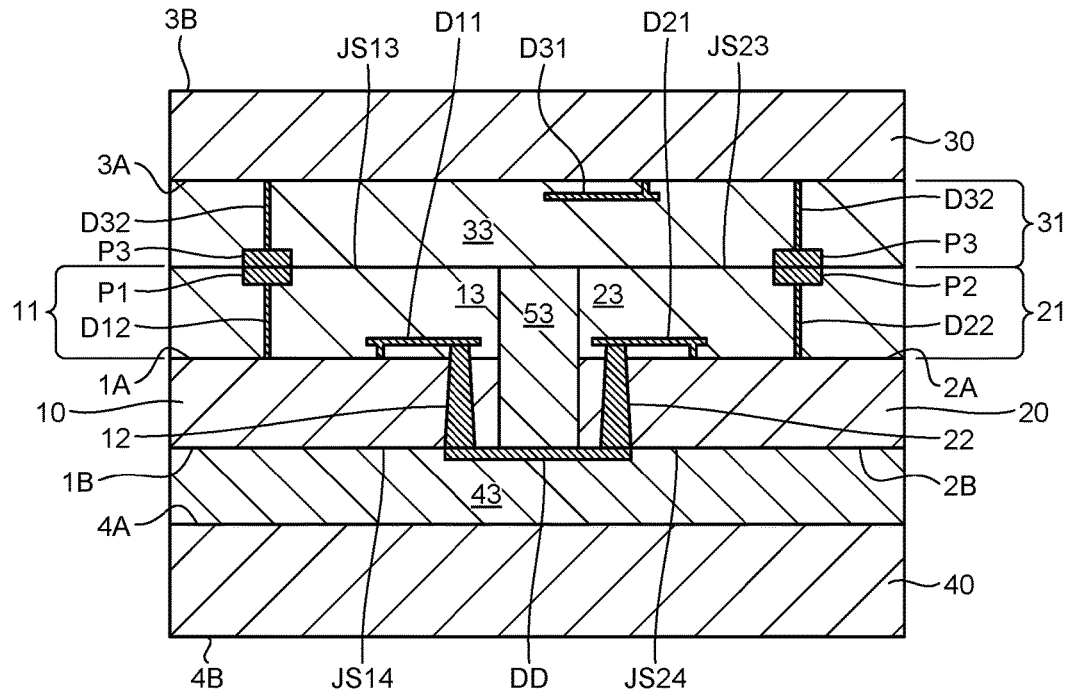
FIGS. 6A and 6B are flowcharts illustrating the example of the manufacturing process procedure of the solid-state imaging element according to the first embodiment of the present disclosure.

As illustrated in FIG. 6A, using the procedure described above, the logic substrate 10 is joined to the support substrate 40 at the joining surface JS14 through the insulating layer 43. In addition, the memory substrate 20 is joined to the support substrate 40 at a joining surface JS24 through the insulating layer 43.

Figure 6B:
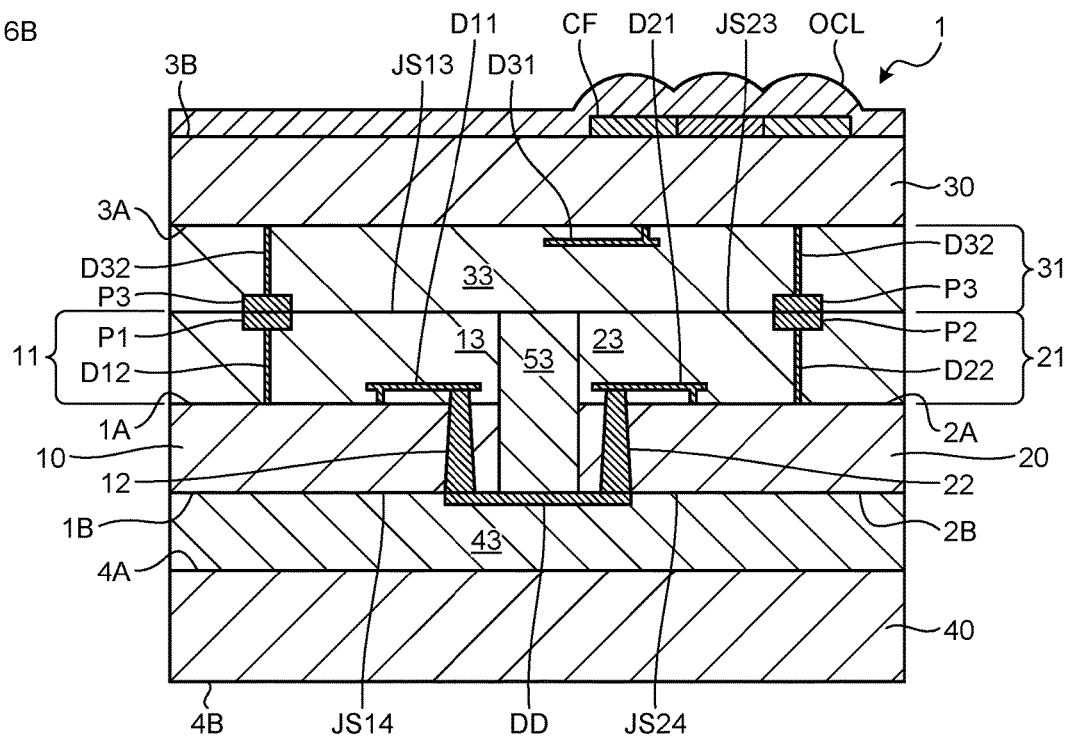

As illustrated in FIG. 6B, the color filter CF and the on-chip lens OCL are formed on the surface 3B of the pixel substrate 30.

Figure 7:
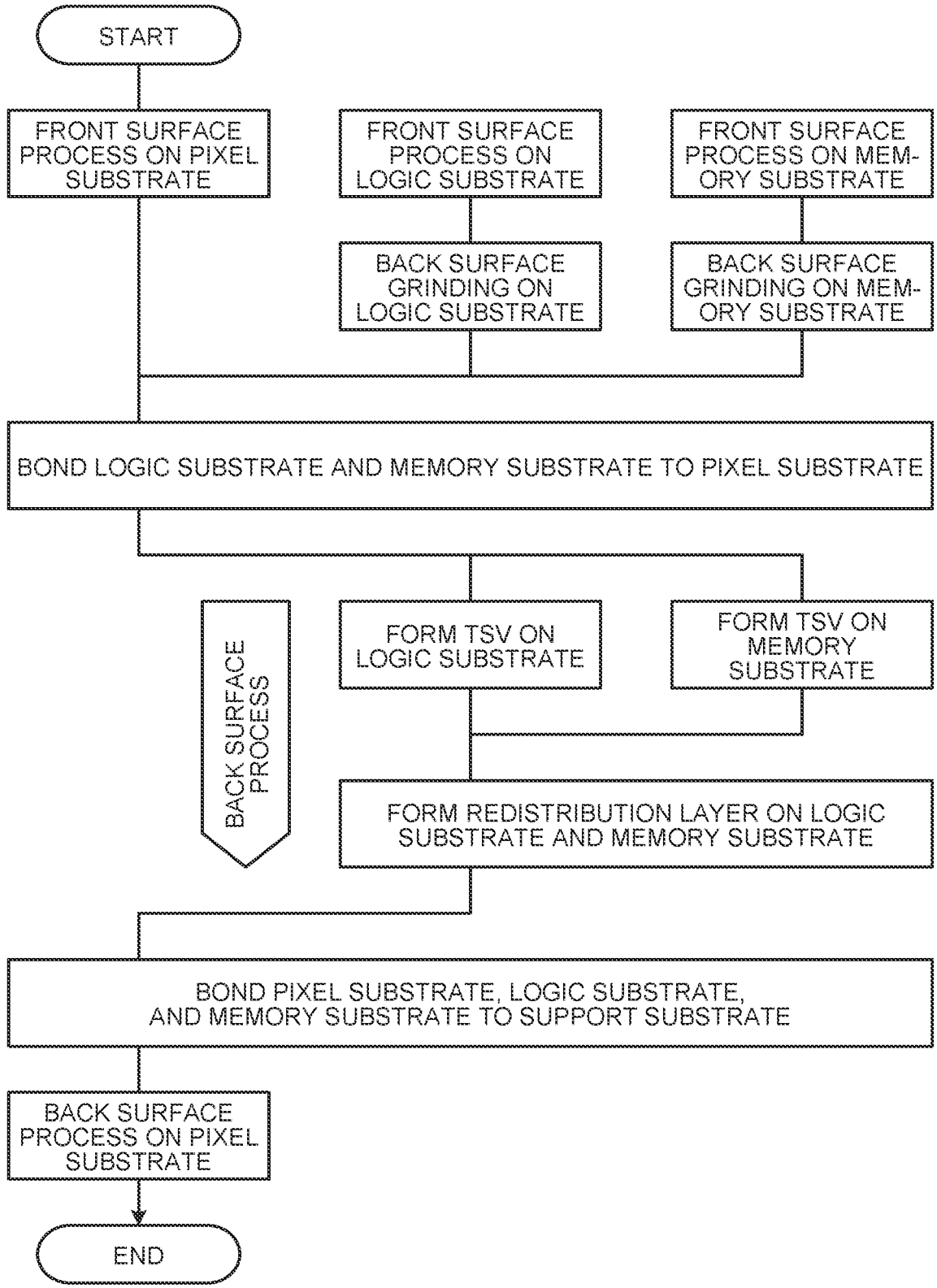
FIG. 7 is a flowchart illustrating an overall image of the manufacturing process of the solid-state imaging element according to the first embodiment of the present disclosure.

FIG. 7 illustrates an overall flow of the process of manufacturing the solid-state imaging element 1 according to the first embodiment. FIG. 7 is a flowchart illustrating an overall image of a manufacturing process of the solid-state imaging element 1 according to the first embodiment of the present disclosure.

As illustrated in FIG. 7, the pixel circuit 31, the logic circuit 11, and the memory circuit 21 are formed by the front surface process on the pixel substrate 30, the logic substrate 10, and the memory substrate 20, respectively. Thereafter, the back surfaces of the logic substrate 10 and the memory substrate 20, namely, the surfaces 1B and 2B, are ground.

Next, the logic substrate 10 and the memory substrate 20 are bonded to the pixel substrate 30.

Next, using a back surface process of the logic substrate 10 and the memory substrate 20, the vias 12 and 22 as TSVs are formed in the logic substrate 10 and the memory substrate 20, respectively, and further, the wiring line DD in the redistribution layer connecting these vias 12 and 22 is formed.

Next, the logic substrate 10 and the memory substrate 20, which have been joined to the pixel substrate 30, are bonded to the support substrate 40.

Next, the color filter CF and the on-chip lens OCL are formed on the pixel substrate 30 by the back surface process of the pixel substrate 30.

The above-described procedure completes the process of manufacturing the solid-state imaging element 1 according to the first embodiment.

Comparative Example

Figure 8:
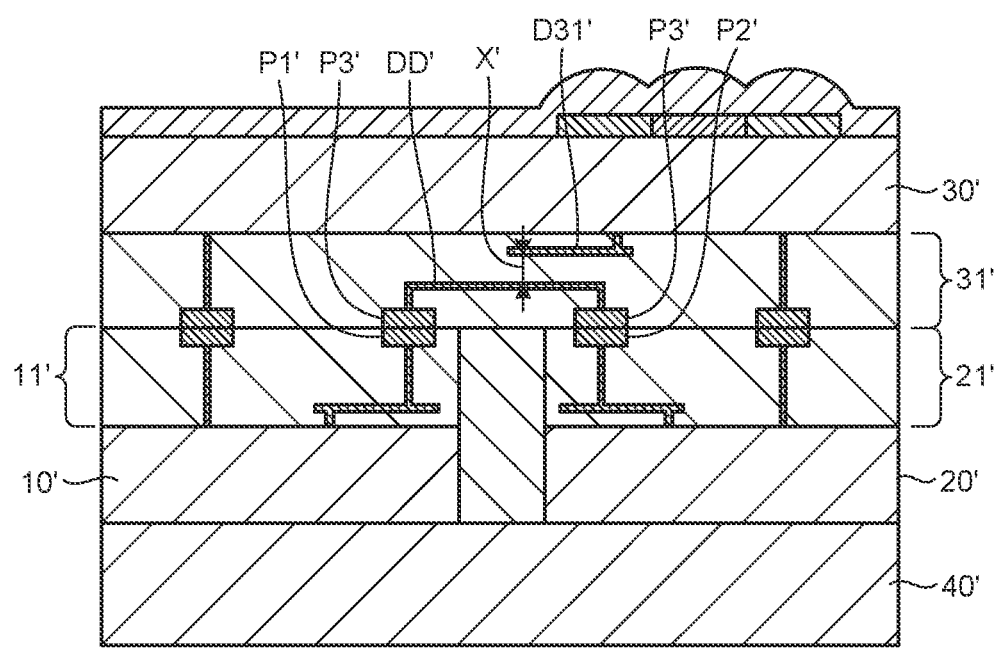
FIG. 8 is a schematic diagram illustrating a part of a solid-state imaging element according to a comparative example of the present disclosure.

Next, problems of a solid-state imaging element of a comparative example will be described with reference to FIG. 8. As illustrated in FIG. 8, the solid-state imaging element of the comparative example has a configuration in which a logic substrate 10' having a logic circuit 11' and a memory substrate 20' having a memory circuit 21' are joined to a pixel substrate 30' having a pixel circuit 31'. These substrates 10', 20', and 30' are further supported by a support substrate 40'. The logic circuit 11' and the memory circuit 21' are electrically connected to each other through electrode pads P1' and P3', a wiring line DD', and electrode pads P3' and P2', on the joining surface side with the pixel substrate 30'. The wiring line DD' is formed on the pixel substrate 30' side.

Unfortunately, however, such a connection method has a problem of proximity in which a distance X' between the wiring line DD' and a wiring line D31' of the pixel substrate 30' is too short, leading to a concern of occurrence of crosstalk. Such crosstalk would cause occurrence of noise in the pixel circuit 31', leading to degradation of the characteristics of the solid-state imaging element. Another problem is that the wiring line DD' is formed in the region of the logic circuit 11', causing a restriction on the layout in the wiring design. In a case where a shield is applied to the wiring line DD' in order to suppress crosstalk, the restriction regarding the layout would be more severe.

In contrast, according to the solid-state imaging element 1 of the first embodiment, the logic circuit 11 and the memory circuit 21 are connected to each other on the side of the surfaces 1B and 2B, opposite to the side facing the pixel substrate 30. With this configuration, the wiring line DD connecting the logic circuit 11 and the memory circuit 21 to each other and the wiring line D31 and the like of the pixel substrate 30 are separated from each other by a distance which is the thickness of the logic substrate 10 and the memory substrate 20, or more. This makes it possible to suppress the crosstalk between the wiring line DD and the wiring line D31, leading to achievement of noise reduction in the pixel circuit 31.

According to the solid-state imaging element 1 of the first embodiment, the wiring line DD is arranged on the surface 1B side of the logic substrate 10 and the surface 2B side of the memory substrate 20. This eliminates the necessity to connect the logic circuit 11 and the memory circuit 21 to each other using the region of the logic circuit 11, increasing the degree of freedom of layout in the wiring design.

According to the solid-state imaging element 1 of the first embodiment, the wiring layer including the wiring line DD connecting the logic circuit 11 and the memory circuit 21 to each other is a redistribution layer formed by a plating technique, for example. This makes it possible to form the wiring line DD by a simple and inexpensive method.

First Modification

Next, a solid-state imaging element according to a first modification of the first embodiment will be described with reference to FIGS. 9A, 9B, 9C, 9D, 10A, and 10B. The solid-state imaging element of the first modification is different from that of the first embodiment in a part of the manufacturing process procedure.

Figure 9A:
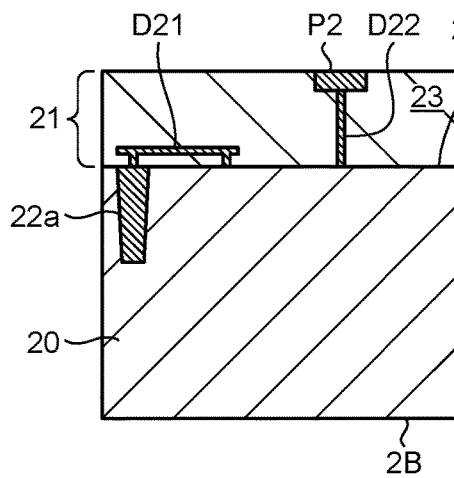
FIGS. 9A, 9B, 9C, and 9D are flowcharts illustrating an example of a manufacturing process procedure of a solid-state imaging element according to a first modification of the first embodiment of the present disclosure.

As illustrated in FIG. 9A, the memory substrate 20, in which the memory circuit 21 is stacked in the insulating layer 23, is formed. The memory substrate 20 is not ground at this stage. The memory substrate 20 is provided with a via 22a reaching halfway through a thick substrate. The via 22a is formed from the surface 2A side of the memory substrate 20 (front surface process), and the wiring line D21 is thereafter formed so as to be connected to the upper surface of the via 22a.

Figure 9B:
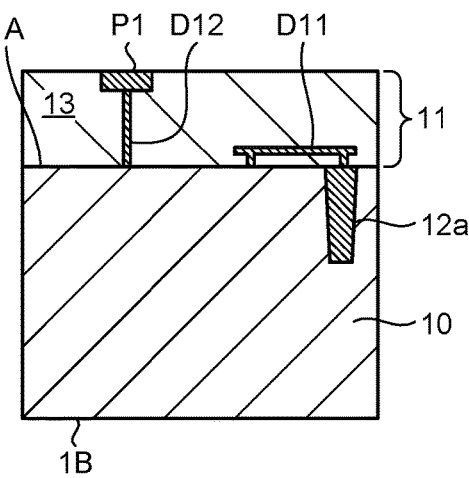

As illustrated in FIG. 9B, the logic substrate 10, in which the logic circuit 11 is stacked in the insulating layer 13, is formed. The logic substrate 10 is not ground at this stage. The logic substrate 10 is provided with a via 12a reaching halfway through the thick substrate. The via 12a is formed from the surface 1A side of the logic substrate 10 (front surface process), and the wiring line D11 is thereafter formed so as to be connected to the upper surface of the via 12a.

Figure 9C:
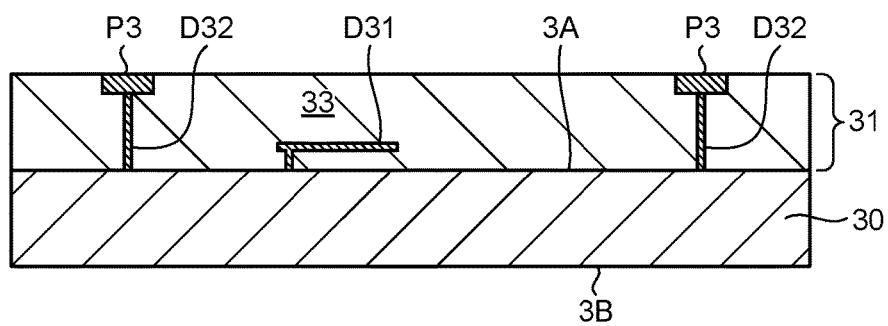

As illustrated in FIG. 9C, the pixel substrate 30, in which the pixel circuit 31 is stacked in the insulating layer 33, is formed. Formation of the logic substrate 10, the memory substrate 20, and the pixel substrate 30 may be performed in any order.

Figure 9D:
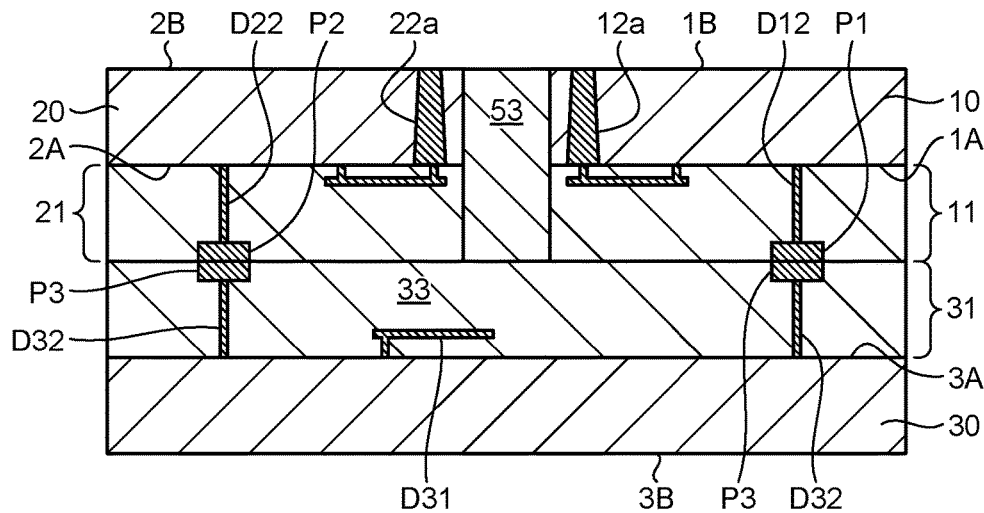

As illustrated in FIG. 9D, the logic substrate 10 and the memory substrate 20 are bonded to the pixel substrate 30 such that the surface 1A of the logic substrate 10 and the surface 2A of the memory substrate 20 face the surface 3A of the pixel substrate 30.

The insulating layer 53 filling a space between the logic substrate 10 and the memory substrate 20 is formed by the CVD process, for example, and the insulating layer 53 is planarized by the CMP process, for example.

The logic substrate 10, the memory substrate 20, and the insulating layer 50 therebetween are ground, so as to thin the logic substrate 10 and the memory substrate 20 until the end portions of the vias 12a and 22a on the surfaces 1B and 2B sides are exposed.

Thereafter, the solid-state imaging element of the first modification is manufactured in a procedure similar to that in the above-described first embodiment.

Figure 10A:
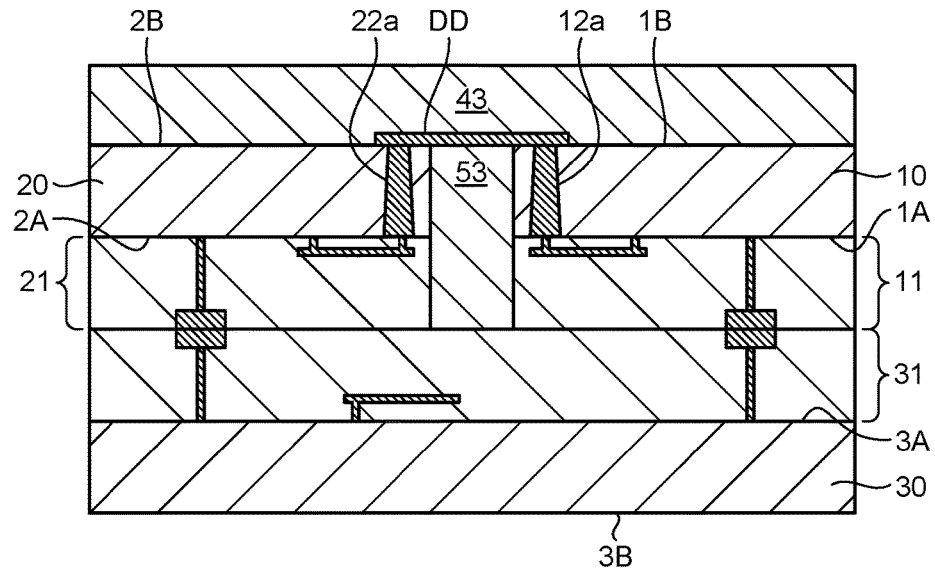
FIGS. 10A and 10B are flowcharts illustrating the example of the manufacturing process procedure of the solid-state imaging element according to the first modification of the first embodiment of the present disclosure.
Figure 10B:
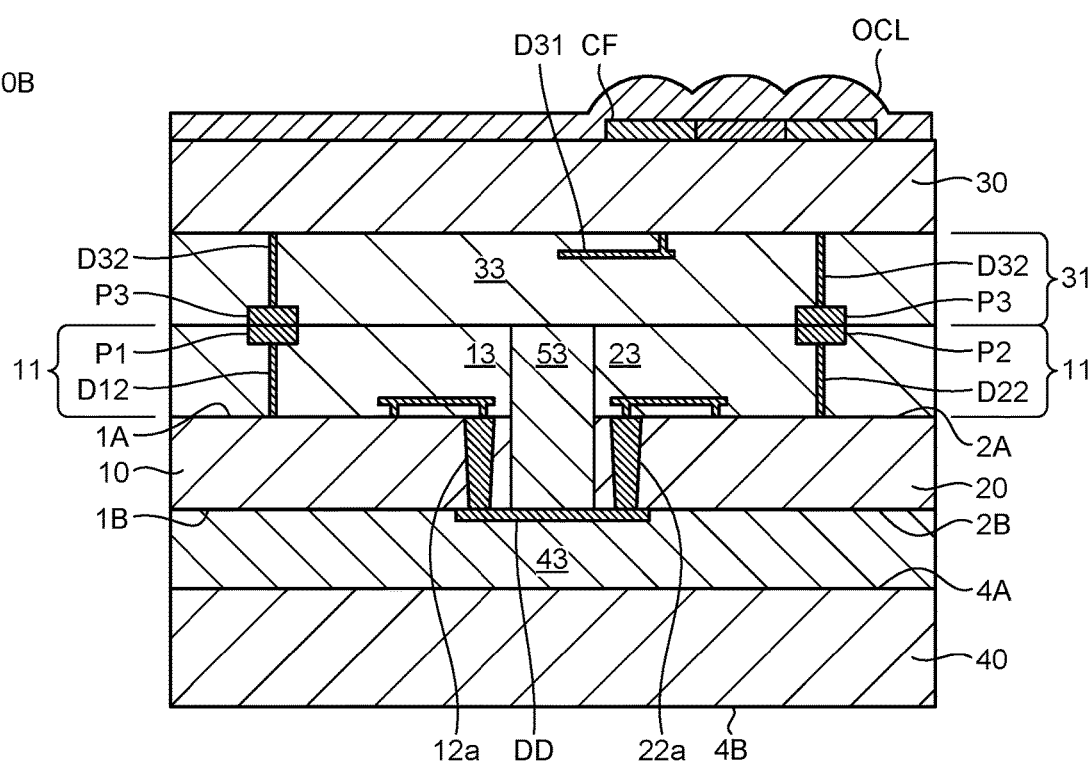

That is, as illustrated in FIG. 10A, the wiring line DD connected to the end portions of the vias 12a and 22a on the surfaces 1B and 2B sides is formed by using a redistribution technique, for example. Furthermore, as illustrated in FIG. 10B, the logic substrate 10 and the memory substrate 20, to which the pixel substrate 30 has been joined, are to be joined to the support substrate 40, so as to form the color filter CF and the on-chip lens OCL on the pixel substrate 30.

The above-described procedure completes the process of manufacturing the solid-state imaging element according to the first modification. In the solid-state imaging element of the first modification, the via 12a, which is the first via formed from the surface 1A side, has a tapered shape in which the diameter decreases from the surface 1A side to the surface 1B side, for example. Furthermore, the via 22a, which is the second via formed from the surface 2A side, has a tapered shape in which the diameter decreases from the surface 2A side to the surface 2B side, for example.

Second Modification

Next, a solid-state imaging element 1b according to a second modification of the first embodiment will be described with reference to FIG. 11. The solid-state imaging element 1b of the second modification is different from the case of the first embodiment in that the wiring layer in which a wiring line DDb is arranged is not a redistribution layer.

Figure 11:
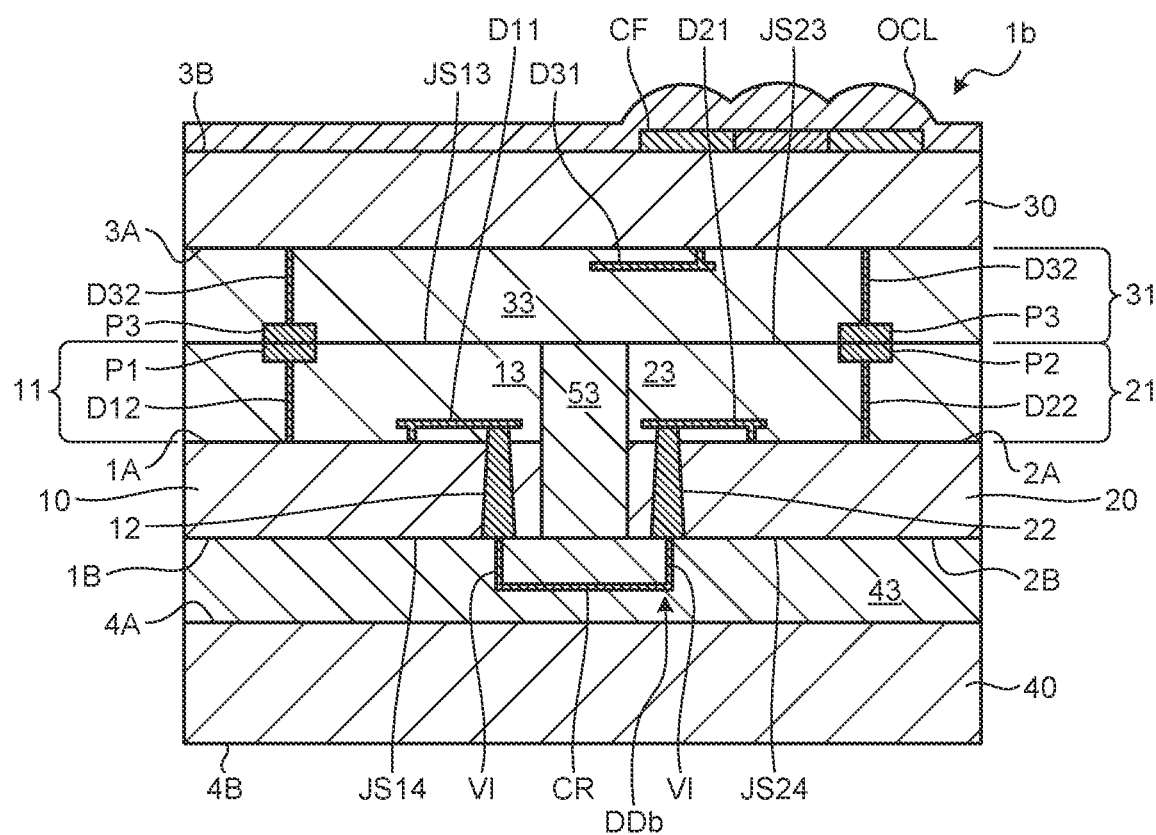
FIG. 11 is a schematic diagram illustrating a part of a solid-state imaging element according to a second modification of the first embodiment of the present disclosure.

As illustrated in FIG. 11, the solid-state imaging element 1b includes the wiring line DDb stacked in the insulating layer 43. More specifically, the wiring line DDb has two via portions VI and one bridge portion CR. One end of one via portion VI is connected to an end portion of the via 12 of the logic substrate 10 on the surface 1B side, while the other end is connected to one end of the bridge portion CR. One end of the other via portion VI is connected to an end portion on the surface 2B side of the via 22 of the memory substrate 20, and the other end is connected to the other end of the bridge portion CR. The wiring line DDb having such a structure is formed by a damascene process using a photolithography technique and a dry etching technique, for example.

According to the solid-state imaging element 1b of the second modification, the wiring line DDb is formed by a photolithography technique and a dry etching technique. This makes it possible to form a finer wiring line DDb with high accuracy, leading to achievement of high integration of the wiring line DDb.

Third Modification

Next, a solid-state imaging element 1c according to a third modification of the first embodiment will be described with reference to FIGS. 12, 13A, 13B, 13C 14A, 14B, and 14C. In addition to the wiring line DDb, the solid-state imaging element 1c of the third modification further includes a shield SSc to which a method of forming the wiring line DDb is applied.

Figure 12:
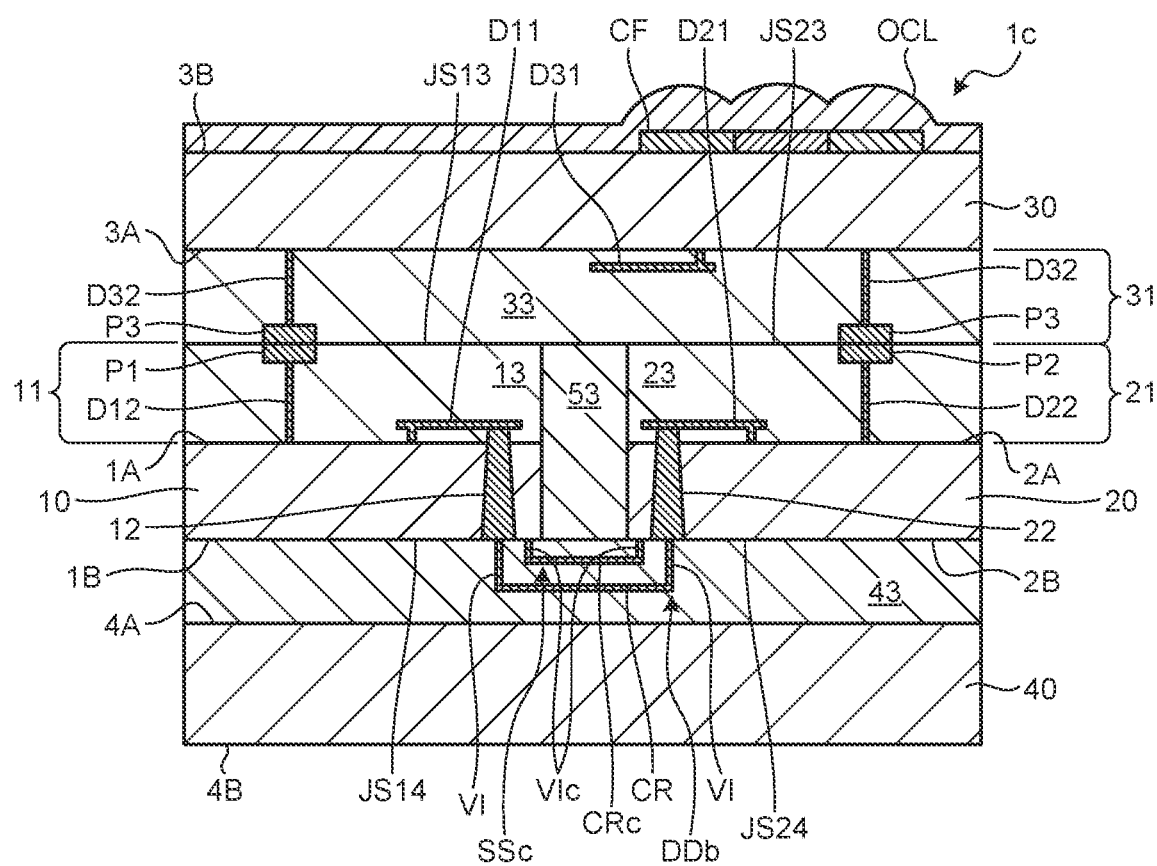
FIG. 12 is a schematic diagram illustrating a part of a solid-state imaging element according to a third modification of the first embodiment of the present disclosure.

As illustrated in FIG. 12, the shield SSc disposed in a shield layer as a conductive layer is arranged between the joining surfaces JS13 and JS23, which join the pixel substrate 30 with the logic substrate 10 and the memory substrate 20, and the wiring line DDb. Similarly to the wiring line DDb, the shield SSc is also stacked in the insulating layer 43. More specifically, the shield SSc includes two via portions VIc and one bridge portion CRc. One end of one via portion VIc is connected to the surface 1B of the logic substrate 10, while the other end is connected to one end of the bridge portion CRc. One end of the other via portion VIc is connected to the surface 2B of the memory substrate 20, while the other end is connected to the other end of the bridge portion CRc. Similarly to the wiring line DDb, the shield SSc having such a structure is formed by the damascene process using a photolithography technique and a dry etching technique, for example.

The wiring line DDb and the shield SSc can be formed using, for example, the dual damascene process illustrated in FIGS. 13A, 13B, 13C, 14A, 14B, and 14C. The flow illustrated from FIGS. 13A, 13B, 13C, 14A, 14B, and 14C are replacements for the flow of FIGS. 4A, 4B, and 4C of the first embodiment described above. FIGS. 13A, 13B, 13C, 14A, 14B, and 14C are enlarged illustrations of the vicinity of the end portion of the via 12 of the logic substrate 10 on the surface 1B side and the end portion of the via 22 of the memory substrate 20 on the surface 2B side.

Figure 13A:
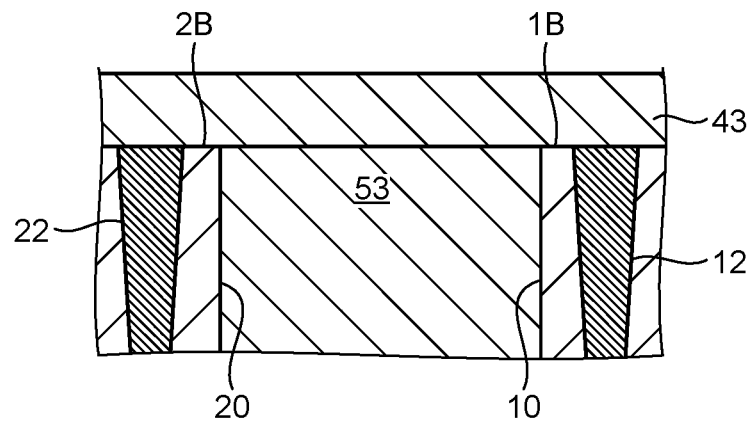
FIGS. 13A, 13B, and 13C are flowcharts illustrating an example of a manufacturing process procedure of the solid-state imaging element according to the third modification of the first embodiment of the present disclosure.

As illustrated in FIG. 13A, the insulating layer 43 is formed on the surface 1B of the logic substrate 10, on the insulating layer 53, and on the surface 2B of the memory substrate 20. At this time, the insulating layer 43 is formed to be thinner than the final thickness.

Figure 13B:
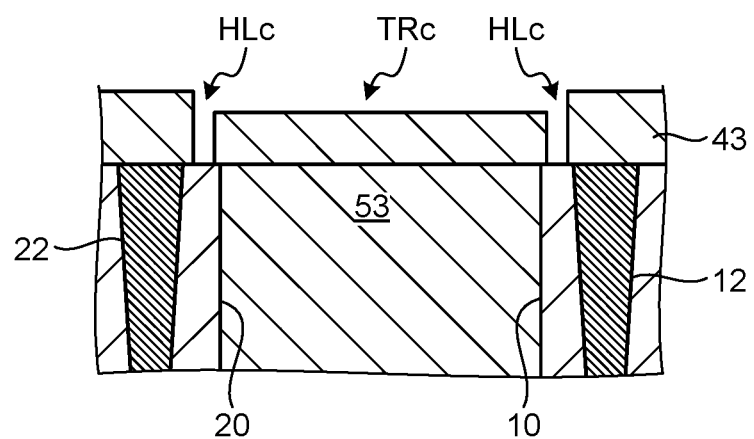

As illustrated in FIG. 13B, for example, a photolithography technique and a dry etching technique are used to form holes HLc, each of which penetrating the insulating layer 43 to reach the surface 1B of the logic substrate 10 and the surface 2B of the memory substrate 20, individually, and to form a trench TRc having each end portion connected to each of the holes HLc.

Figure 13C:
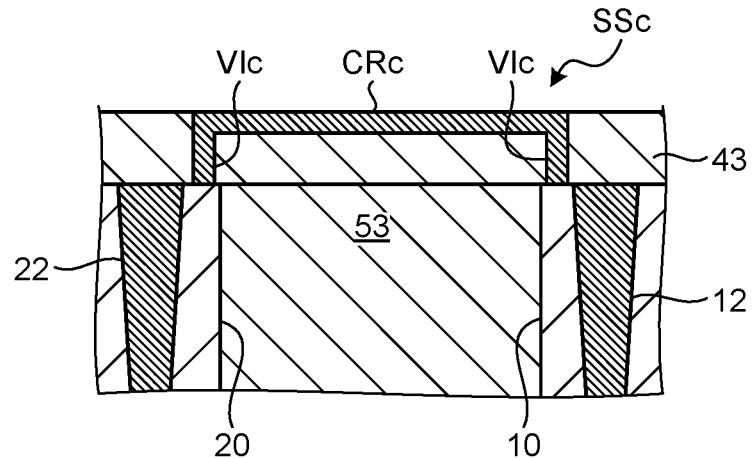

As illustrated in FIG. 13C, the inside of the hole HLc and the inside of the trench TRc are filled with a conductive material such as Cu by the CVD process, for example, and an excessive conductive material is removed by the CMP process or the like to form the shield SSc having the via portions VIc and the bridge portion CRc.

Figure 14A:
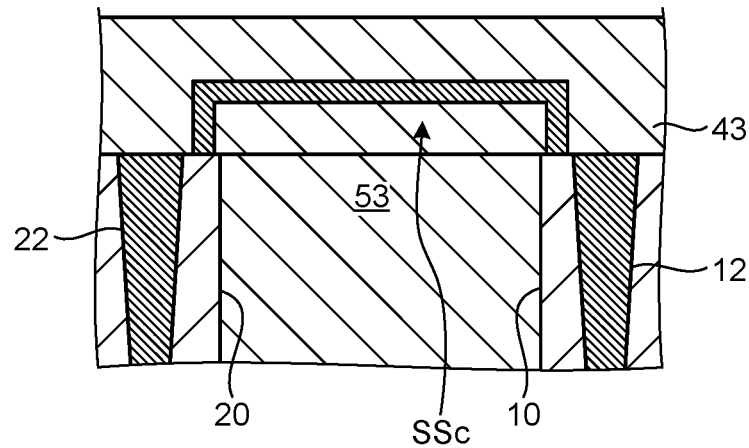
FIGS. 14A, 14B, and 14C are flowcharts illustrating the example of the manufacturing process procedure of the solid-state imaging element according to the third modification of the first embodiment of the present disclosure.

As illustrated in FIG. 14A, the insulating layer 43 is further formed so as to cover the shield SSc.

Figure 14B:
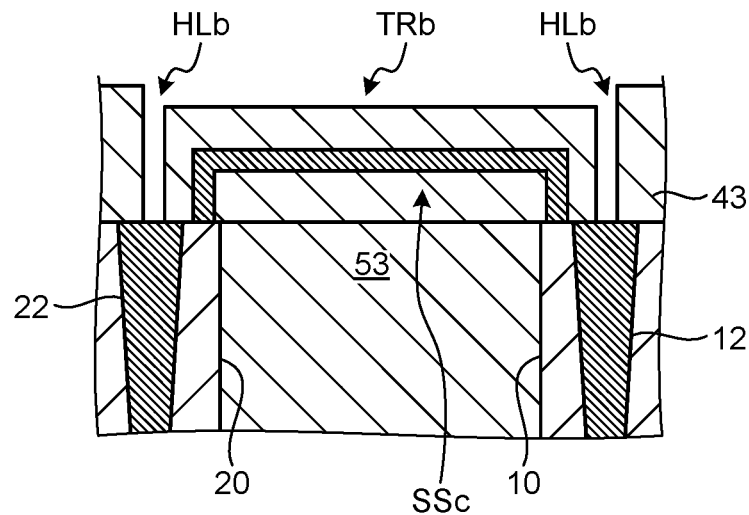

As illustrated in FIG. 14B, a photolithography technique and a dry etching technique are used, for example, to form holes HLb, each of which penetrating the insulating layer 43 to reach the via 12 of the logic substrate 10 and the via 22 of the memory substrate 20, individually, and to form a trench TRb having each end portion connected to each of the holes HLb.

Figure 14C:
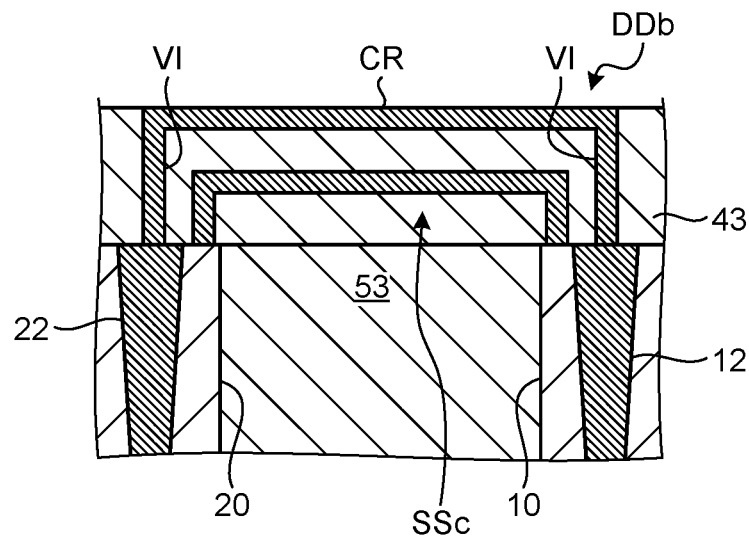

As illustrated in FIG. 14C, the inside of the hole HLb and the inside of the trench TRb are filled with a conductive material such as Cu by the CVD process, for example, and an excessive conductive material is removed by the CMP process or the like to form the wiring line DDb having the via portions VI and the bridge portion CR.

The above-described procedure completes the formation of the wiring line DDb and the shield SSc. In the above example, the dual damascene process of collectively forming the via portions and the bridge portion is used, but a single damascene process of separately forming the via portions and the bridge portion may be used.

According to the solid-state imaging element 1c of the third modification, the shield SSc is disposed on the pixel substrate 30 side of the wiring line DDb. With this configuration, the wiring line DDb is shielded against the wiring line D31 and the like of the pixel substrate 30, making it possible to further suppress the crosstalk between the wiring line DDb and the wiring line D31, leading to achievement of the reduction of the noise in the pixel circuit 31.

Fourth Modification

Next, a solid-state imaging element 1d of a fourth modification of the first embodiment will be described with reference to FIG. 15. The solid-state imaging element 1d of the fourth modification is different from the case of the first embodiment described above in that two wiring lines DDda and DDdb intersect each other.

As illustrated in the plan view of FIG. 15(a), the wiring lines DDda and DDdb connecting the logic substrate 10 and the memory substrate 20 to each other intersect each other.

As illustrated in the perspective view of FIG. 15(b), such a configuration can be obtained by arranging one of the wiring lines, namely, the wiring line DDdb, to be positioned higher than the other wiring line, namely the wiring line DDda, so as to allow the two wiring lines DDda and DDdb to three-dimensionally intersect each other.

These wiring lines DDda and DDdb can be easily formed by the photolithography technique and the dry etching technique as described in the above second and third modifications, for example. The wiring layer including the one of the wiring lines, namely, the wiring line DDda, may be a redistribution layer using the plating technique as described in the first embodiment. Alternatively, vias may be further formed on the vias 12 and 22 so as to form both wiring layers including the wiring lines DDda and DDdb are to be implemented as redistribution layers using a plating technique.

Fifth Modification

Although the above-described first embodiment and the like have a configuration in which one logic substrate 10 and one memory substrate 20 are joined to the pixel substrate 30, the present invention is not limited to this configuration. Hereinafter, some examples of joining various different substrates to the pixel substrate 30 will be described with reference to FIGS. 16A, 16B, and 16C as a solid-state imaging element of a fifth modification of the first embodiment.

Figure 16A:
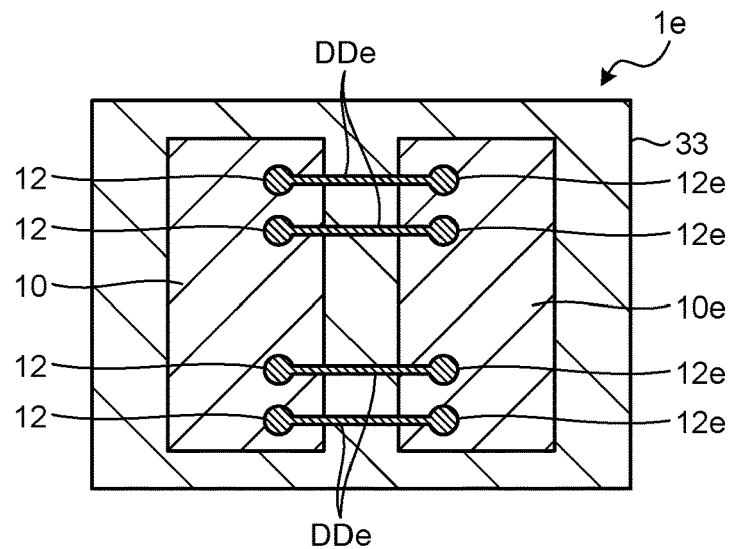
FIGS. 16A, 16B, and 16C are schematic diagrams illustrating a part of a solid-state imaging element according to a fifth modification of the first embodiment of the present disclosure.

As illustrated in FIG. 16A, a solid-state imaging element 1e has a configuration in which two logic substrates 10 and 10e are bonded to a pixel substrate 30. The logic circuits included in the two logic substrates 10 and 10e are electrically connected to each other by a via 12 of the logic substrate 10, a via 10e of the logic substrate 12e, and a wiring line DDe joining these vias 12 and 12e to each other.

Figure 16B:
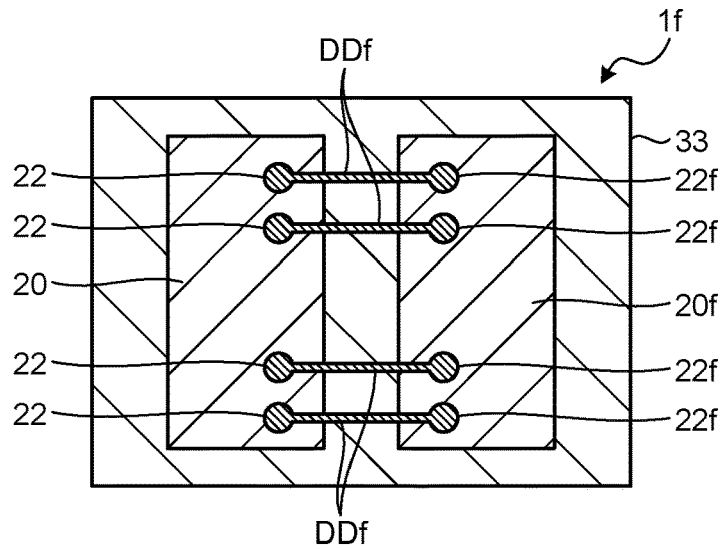

As illustrated in FIG. 16B, a solid-state imaging element 1f has a configuration in which two memory substrates 20 and 20f are bonded to a pixel substrate 30. The memory circuits included in the two memory substrates 20 and 20f are electrically connected to each other by a via 22 of the memory substrate 20, a via 20f of the memory substrate 22f, and a wiring line DDf joining these vias 22 and 22f to each other.

Figure 16C:
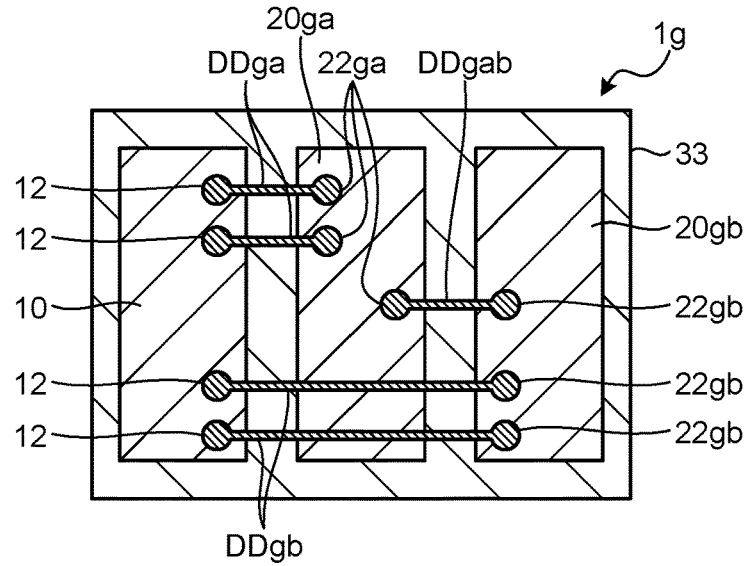

As illustrated in FIG. 16C, a solid-state imaging element 1g has a configuration in which one logic substrate 10 and two memory substrates 20ga and 20gb are bonded to a pixel substrate 30. The logic circuit of the logic substrate 10 and the memory circuit of the memory substrate 20ga are electrically connected to each other by a via 12 of the logic substrate 10, a via 22ga of the memory substrate 20ga, and a wiring line DDga joining these vias 12 and 22ga to each other. The logic circuit of the logic substrate 10 and the memory circuit of the memory substrate 20gb are electrically connected to each other by a via 12 of the logic substrate 10, a via 22gb of the memory substrate 20gb, and a wiring line DDgb joining these vias 12 and 22gb to each other. The memory circuits included in the memory substrate 20ga and the memory substrate 20gb are electrically connected to each other by the via 22ga of the memory substrate 20ga, the via 22gb of the memory substrate 20gb, and a wiring line DDgab joining these vias 22ga and 22gb to each other.

In addition to the above, the solid-state imaging element of the fifth modification can have a configuration in which various substrates of arbitrary numbers are bonded with the pixel substrate 30. The solid-state imaging element of the fifth modification may include a shield layer in addition to the wiring layer.

Second Embodiment

Next, a solid-state imaging element 2 of a second embodiment will be described with reference to FIGS. 17, 18A, 18B, 19A, 19B, 20A, 20B, 21A, 21B, 22, 23, and 24. The solid-state imaging element 2 of the second embodiment is different from the case of the first embodiment described above in that a wiring line DDh is provided on the surface 4B side of the support substrate 40.

Configuration Example of Solid-State Imaging Element

Figure 17:
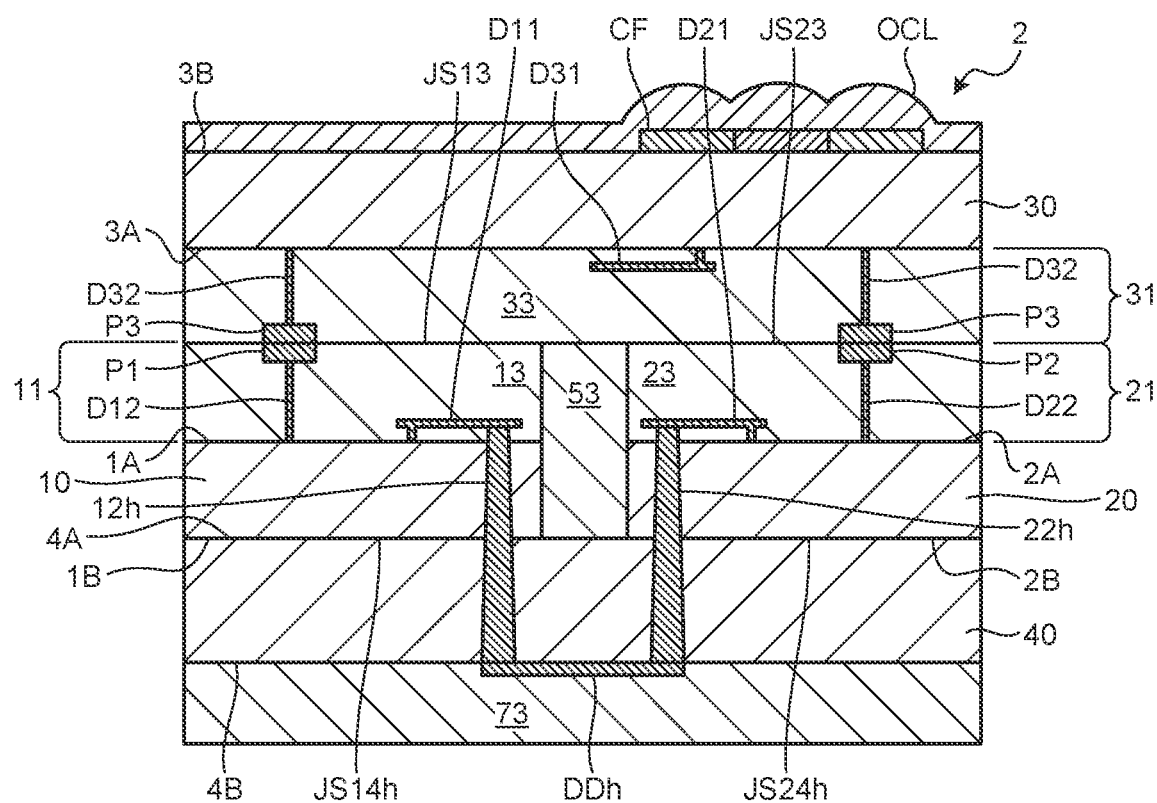
FIG. 17 is a schematic diagram illustrating a part of a solid-state imaging element according to a second embodiment of the present disclosure.

FIG. 17 is a schematic diagram illustrating a part of the solid-state imaging element 2 according to the second embodiment of the present disclosure. As illustrated in FIG. 17, the solid-state imaging element 2 includes the support substrate 40 directly joined both to the logic substrate 10 and to the memory substrate 20. That is, the surface 1B of the logic substrate 20 and the surface 2B of the memory substrate 20 are bonded to the surface 4A of the support substrate 40 at joining surfaces JS14h and JS24h, respectively.

The logic circuit 11 and the memory circuit 21 are electrically connected to each other through a via 12h as a first via penetrating the support substrate 40 and the logic substrate 10, a via 22h as a second via penetrating the support substrate 40 and the memory substrate 20, and the wiring line DDh joining these vias 12h and 22h to each other.

The wiring line DDh is disposed on the surface 4B of the support substrate 40, which is the surface on the side opposite to the side on which the logic substrate 10 and the memory substrate 20 are disposed. On the surface 4B of the support substrate 40, an insulating layer 73 is disposed to cover the wiring line DDh.

Example of Process of Manufacturing Solid-State Imaging Element

Next, an example of a process of manufacturing the solid-state imaging element 2 according to the second embodiment will be described with reference to FIGS. 18A, 18B, 19A, 19B, 20A, 20B, 21A, 21B, and 22. FIGS. 18A, 18B, 19A, 19B, 20A, 20B, 21A, and 21B are flowcharts illustrating an example of a manufacturing process procedure of the solid-state imaging element 2 according to the second embodiment of the present disclosure.

Figure 18A:
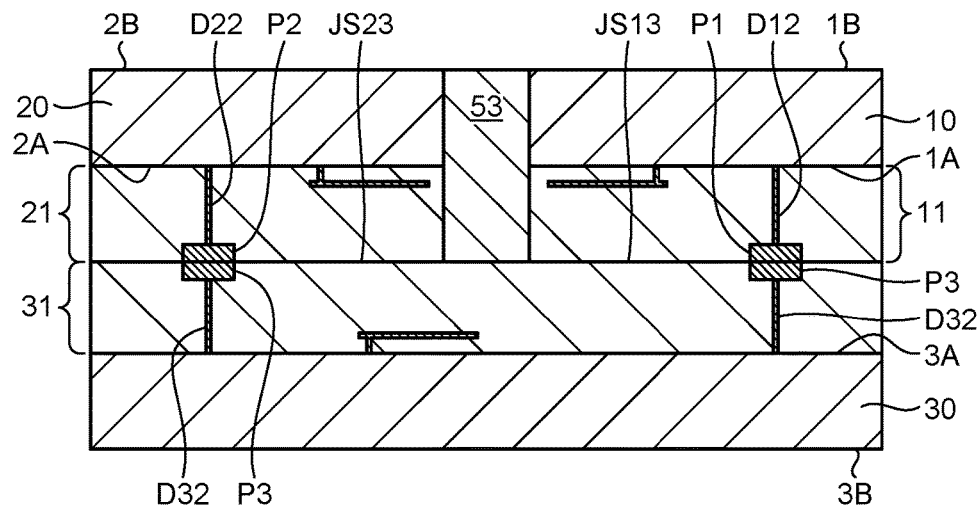
FIGS. 18A and 18B are flowcharts illustrating an example of a manufacturing process procedure of the solid-state imaging element according to the second embodiment of the present disclosure.

As illustrated in FIG. 18A, the pixel substrate 30 in which the logic substrate 10 and the memory substrate 20 are bonded to each other is formed. The process up to this point is similar to the process up to FIG. 3A of the first embodiment described above.

Figure 18B:
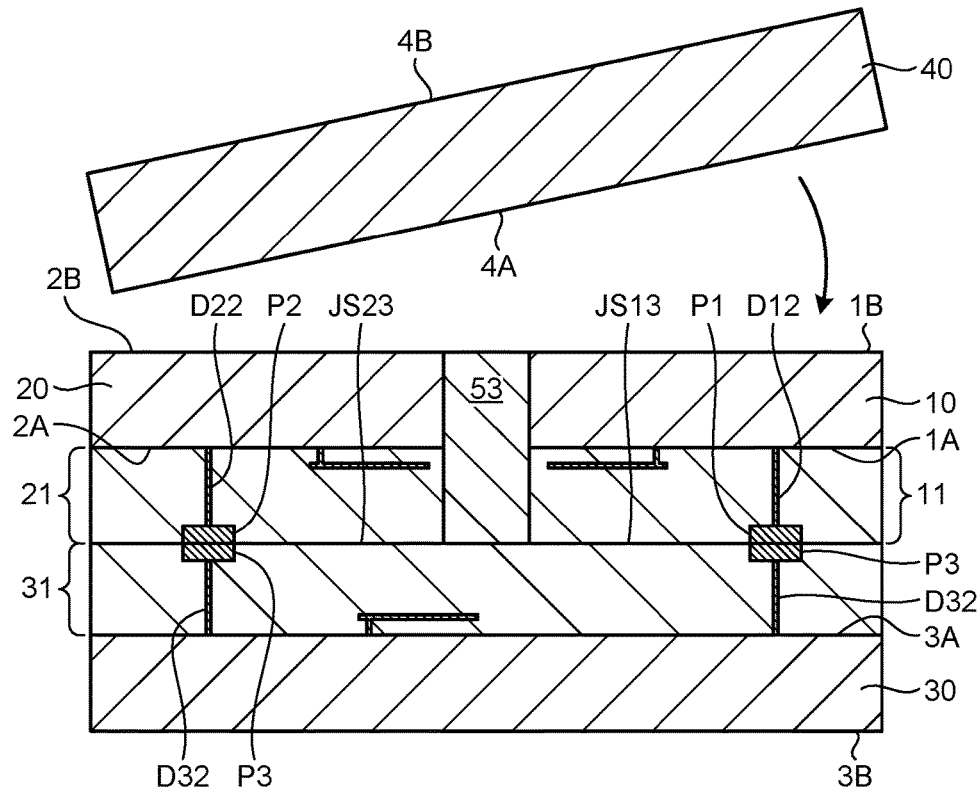

As illustrated in FIG. 18B, the surface 4A of the support substrate 40 is bonded to the surface 1B of the logic substrate 10 and the surface 2B of the memory substrate 20, which have been bonded to the pixel substrate 30.

Figure 19A:
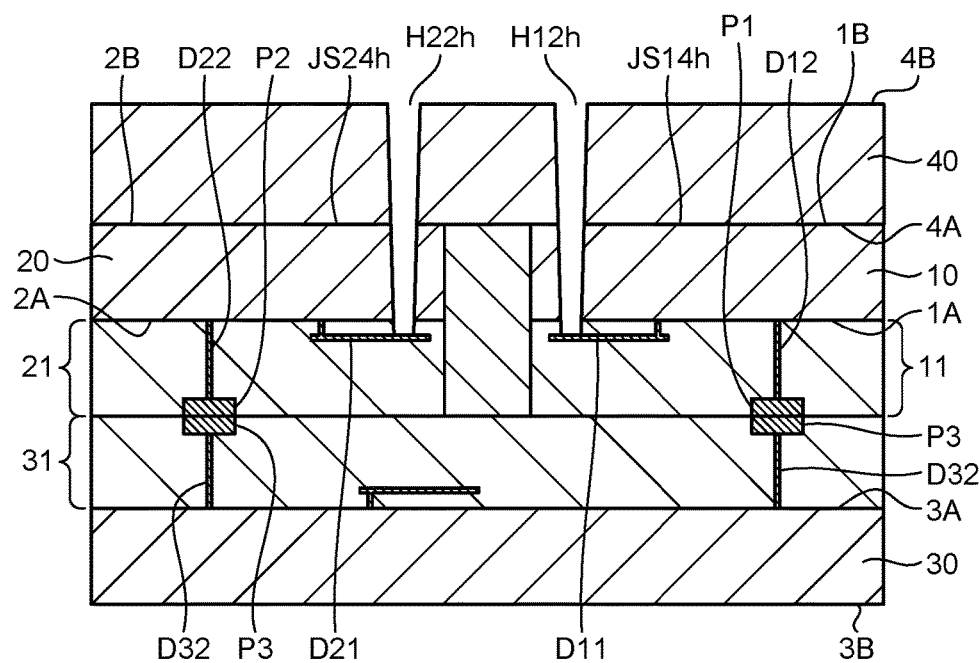
FIGS. 19A and 19B are flowcharts illustrating the example of the manufacturing process procedure of the solid-state imaging element according to the second embodiment of the present disclosure.

As illustrated in FIG. 19A, a through hole H12h which penetrates the support substrate 40 and the logic substrate 10 from the surface 4B side of the support substrate 40 and reaches, for example, a wiring line DD11 is formed. In addition, a through hole H22h which penetrates the support substrate 40 and the memory substrate 20 from the surface 4B side of the support substrate 40 and reaches, for example, a wiring line DD21 is formed.

Figure 19B:
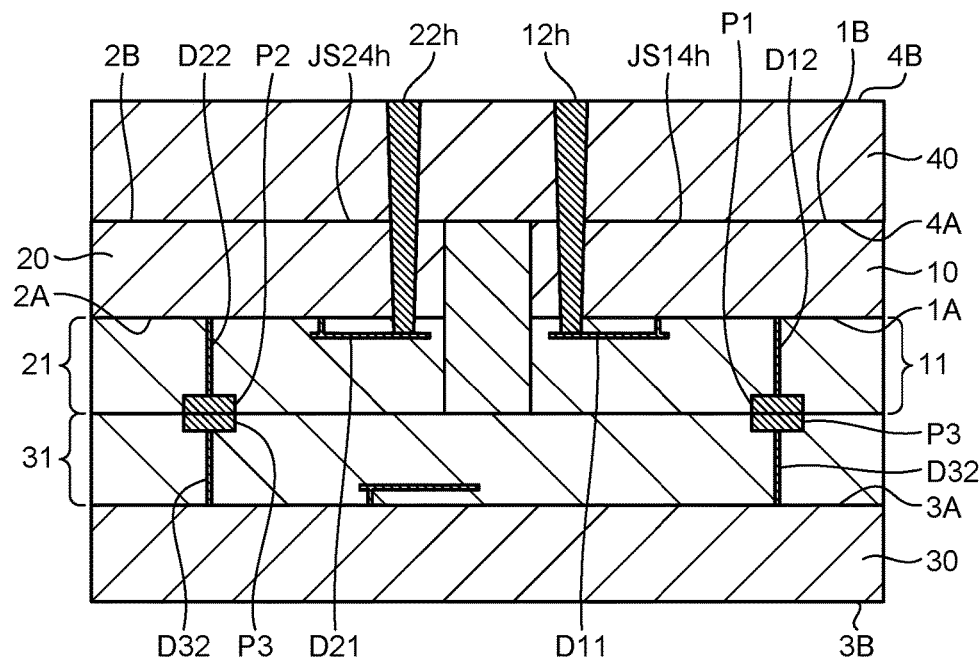

As illustrated in FIG. 19B, the through hole H12h is filled with a conductive material such as Cu to form the via 12h that penetrates the support substrate 40 and the logic substrate 10 to be connected, for example, to the wiring line D11. In addition, the through hole H22h is filled with a conductive material such as Cu to form the via 22h which penetrates the support substrate 40 and the memory substrate 20 to be connected, for example, to the wiring line D21.

The vias 12h and 22h formed from the surface 4B side of the support substrate 40 each have a tapered shape in which the diameter decreases from the surface 4B side of the support substrate 40 to the surface 1A side of the logic substrate 10 and the surface 2A side of the memory substrate 20, for example.

As illustrated in FIG. 20A, a resin 60h having a trench pattern 60htr is formed in a region including the vias 12h and 22h on the surface 4B of the support substrate 40. Subsequently, the trench pattern 60htr is filled with a conductive material such as Cu by a plating method, for example, to form the wiring line DDh.

As illustrated in FIG. 20B, after the resin 60h is peeled off, the insulating layer 73 is formed on the surface 4B of the support substrate 40 so as to cover the wiring line DDh.

Figure 21A:
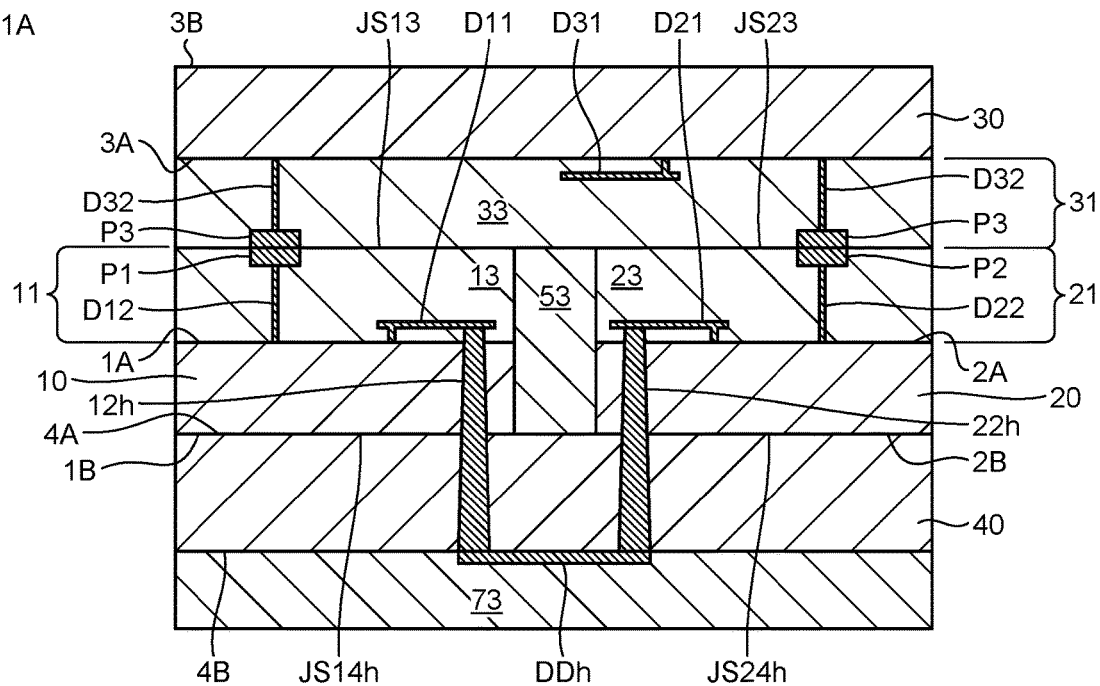
FIGS. 21A and 21B are flowcharts illustrating the example of the manufacturing process procedure of the solid-state imaging element according to the second embodiment of the present disclosure.

As illustrated in FIG. 21A, the stacked substrates, namely, the support substrate 40, logic substrate 10, memory substrate 20, and pixel substrate 30, are inverted, to be arranged such that the support substrate 40 faces downward and the pixel substrate 30 faces upward.

Figure 21B:
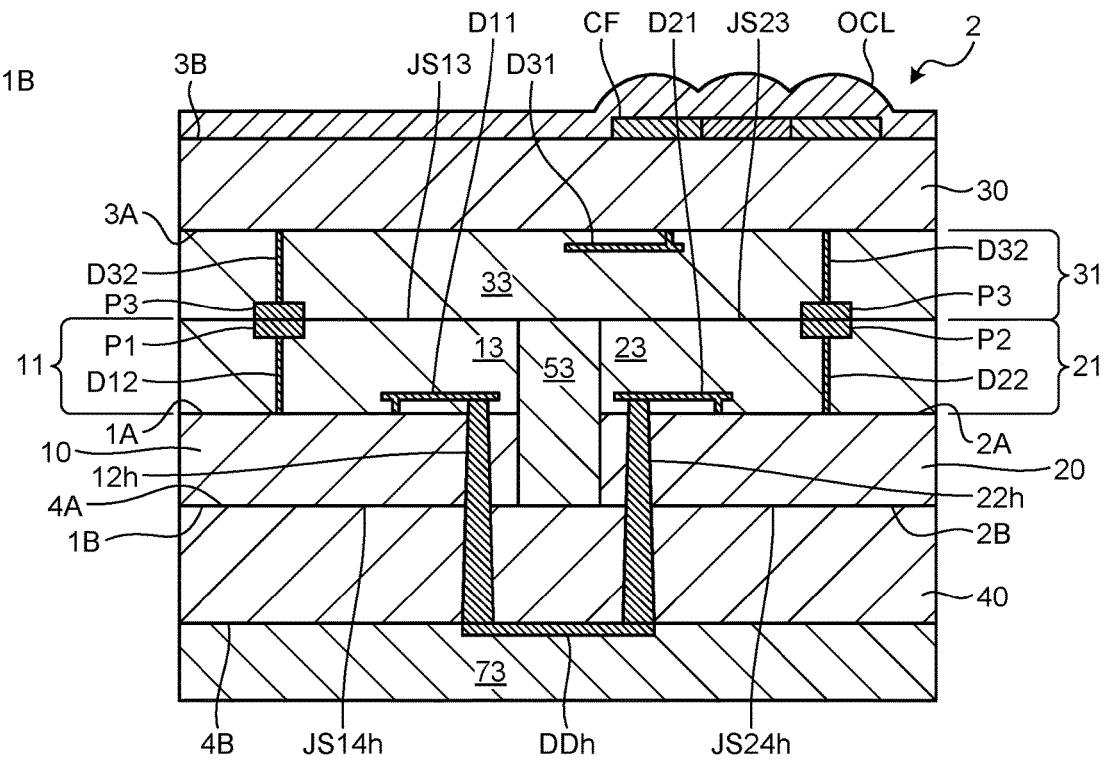

As illustrated in FIG. 21B, the color filter CF and the on-chip lens OCL are formed on the surface 3B of the pixel substrate 30.

Figure 22:
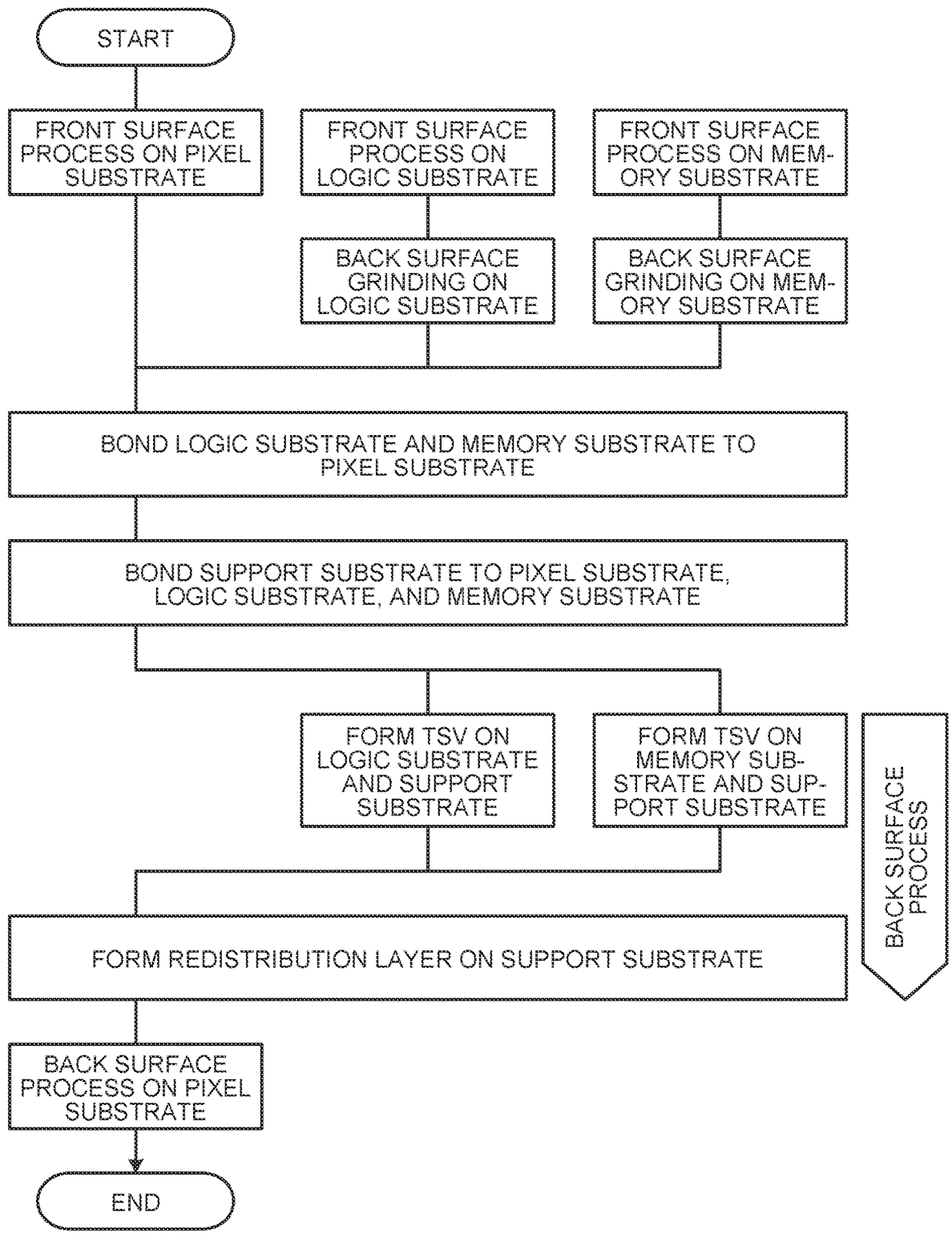
FIG. 22 is a flowchart illustrating an overall image of the manufacturing process of the solid-state imaging element according to the second embodiment of the present disclosure.

FIG. 22 illustrates an overall flow of manufacturing process of the solid-state imaging element 2 of the second embodiment. FIG. 22 is a flowchart illustrating an overall image of a manufacturing process of the solid-state imaging element 2 according to the second embodiment of the present disclosure.

As illustrated in FIG. 22, the process is similar to that of the first embodiment described above up to the point where the logic substrate 10 and the memory substrate 20 are bonded to the pixel substrate 30.

Next, the support substrate 40 is joined to the logic substrate 10 and the memory substrate 20, which have been bonded to the pixel substrate 30.

Next, using a back surface process of the support substrate 40, the vias 12h and 22h as TSVs are formed in the support substrate 40, the logic substrate 10 and the memory substrate 20, respectively, and further, the wiring line DDh in the redistribution layer connecting these vias 12h and 22h is formed on the support substrate 40.

Next, the color filter CF and the on-chip lens OCL are formed on the pixel substrate 30 by the back surface process of the pixel substrate 30.

The above-described procedure completes the process of manufacturing the solid-state imaging element 2 according to the second embodiment.

According to the solid-state imaging element 1 of the first embodiment, the logic circuit 11 and the memory circuit 21 are connected to each other on the surface 4B side of the support substrate 40. With this configuration, the wiring line DDh connecting the logic circuit 11 and the memory circuit 21 to each other and the wiring line D31 and the like of the pixel substrate 30 are separated by a distance which is a sum of the thickness of the logic substrate 10, the memory substrate 20, and the thickness of the support substrate 40, or more. This makes it possible to further suppress the crosstalk between the wiring line DD and the wiring line D31, leading to enhanced noise reduction in the pixel circuit 31.

First Modification

Next, a solid-state imaging element 2i according to a first modification of the second embodiment will be described with reference to FIG. 23. The solid-state imaging element 2i of the first modification includes a wiring line DDi formed by a photolithography technique and a dry etching technique.

Figure 23:
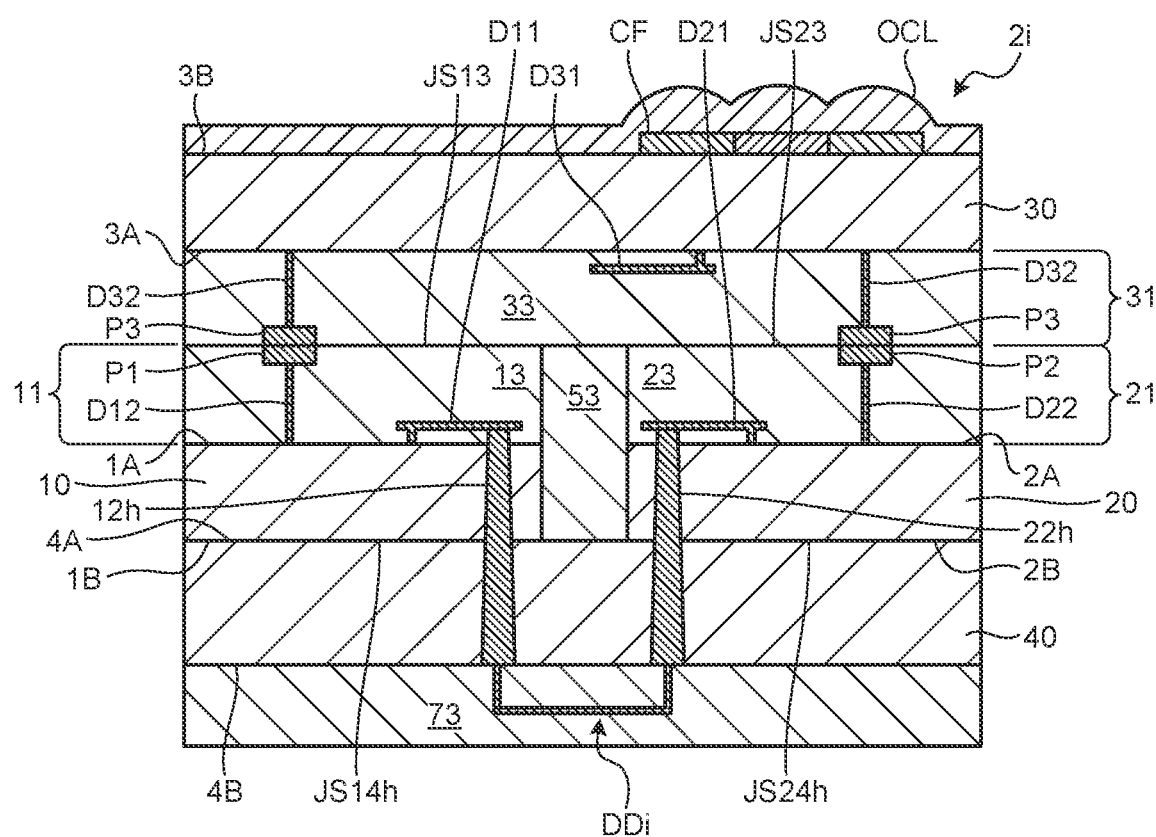
FIG. 23 is a schematic diagram illustrating a part of a solid-state imaging element according to a first modification of the second embodiment of the present disclosure.

FIG. 23 is a schematic diagram illustrating a part of the solid-state imaging element 2i according to the first modification of the second embodiment of the present disclosure. As illustrated in FIG. 23, the solid-state imaging element 2i includes the wiring line DDi having two via portions and one bridge portion, similarly to the second modification of the first embodiment described above. The wiring line DDi is stacked in the insulating layer 73. The wiring line DDi is formed by a photolithography technique and a dry etching technique, for example.

According to the solid-state imaging element 2i of the first modification, the finer wiring line DDi can be accurately formed by the photolithography technique and the dry etching technique, for example, leading to achievement of high integration of the wiring line DDi.

Second Modification

Next, a solid-state imaging element 2j according to a second modification of the second embodiment will be described with reference to FIG. 24. In addition to the wiring line DDi, the solid-state imaging element 2j of the second modification further includes a shield SSj which is disposed in a shield layer as a conductive layer and to which a method of forming the wiring line DDi is applied.

Figure 24:
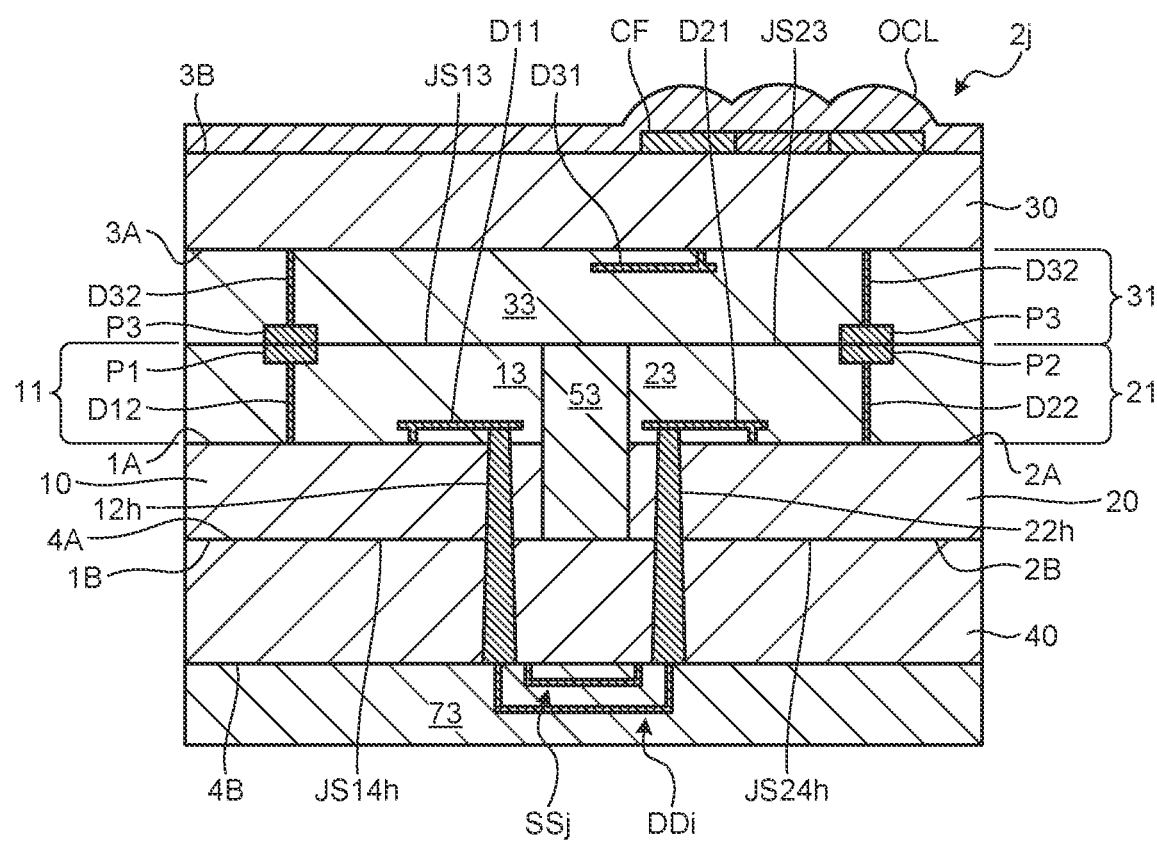
FIG. 24 is a schematic diagram illustrating a part of a solid-state imaging element according to a second modification of the second embodiment of the present disclosure.

FIG. 24 is a schematic diagram illustrating a part of a solid-state imaging element 2j according to the second modification of the second embodiment of the present disclosure. As illustrated in FIG. 24, the solid-state imaging element 2j includes the shield SSj disposed in a shield layer having two via portions and one bridge portion, similarly to the third modification of the first embodiment described above. The shield SSj is also stacked in the insulating layer 73. Similarly to the wiring line DDi, the shield SSj is formed by the photolithography technique and the dry etching technique.

According to the solid-state imaging element 2j of the second modification, the crosstalk between the wiring line DDb and the wiring line D31 can be further suppressed by the shield SSc arranged on the pixel substrate 30 side of the wiring line DDi, leading to enhanced noise reduction in the pixel circuit 31.

Third Modification

Even with a configuration having the wiring layer on the support substrate 40 as in the solid-state imaging element of the second embodiment and the like, it is possible to form a configuration in which various substrates of an arbitrary number, such as a plurality of logic substrates and a plurality of memory substrates, are bonded to the pixel substrate 30, as described as the configuration of the fifth modification of the first embodiment.

The solid-state imaging element of the third modification may include a shield layer in addition to the wiring layer on the support substrate 40.

The effects described in the present specification are merely examples, and thus, there may be other effects, not limited to the exemplified effects.

Other Embodiments

Note that the present technology can also have the following configurations.

(1)
A solid-state imaging element comprising:
a first semiconductor substrate having a first semiconductor circuit on a first surface of the substrate;
a second semiconductor substrate having a second semiconductor circuit on a second surface of the substrate; and
a pixel substrate having a pixel circuit on one surface of the substrate,
wherein the first semiconductor substrate, the second semiconductor substrate, and the pixel substrate are joined to each other such that
the first surface of the first semiconductor substrate and the second surface of the second semiconductor substrate face the one surface of the pixel substrate, and
the first semiconductor circuit and the second semiconductor circuit are connected to each other on the first surface side and the second surface side, opposite to the side facing the pixel substrate.

(2)
The solid-state imaging element according to (1),
wherein the first semiconductor circuit and the second semiconductor circuit are connected to each other through
a first via penetrating the first semiconductor substrate, a second via penetrating the second semiconductor substrate, and a wiring line connecting the first via and the second via to each other.

(3)
The solid-state imaging element according to (2),
wherein a shield is disposed between a joining surface which joins the first semiconductor substrate and the second semiconductor substrate to the pixel substrate, and the wiring line.

(4)
The solid-state imaging element according to (2) or (3),
wherein the wiring line is disposed on the first semiconductor substrate and the second semiconductor substrate.

(5)
The solid-state imaging element according to (2) or (3), further comprising
a support substrate joined to a side of the first semiconductor substrate and the second semiconductor substrate, opposite to the side facing the pixel substrate,
wherein the first via and the second via each penetrate the support substrate, and
the wiring line is disposed on the support substrate on a side opposite to the first semiconductor substrate and the second semiconductor substrate.

(6)
The solid-state imaging element according to any one of (2) to (5),
wherein a wiring layer in which the wiring line is disposed is a redistribution layer formed by a plating technique.

(7)
The solid-state imaging element according to any one of (2) to (5),
wherein a wiring layer in which the wiring line is disposed is a wiring layer formed by a photolithography technique and a dry etching technique.

(8)
The solid-state imaging element according to any one of (1) to (7),
wherein the first semiconductor substrate is a logic substrate including a logic circuit as the first semiconductor circuit, and
the second semiconductor substrate is a memory substrate including a memory circuit as the second semiconductor circuit.

(9)
The solid-state imaging element according to any one of (1) to (7),
wherein the first semiconductor substrate is a first logic substrate including a first logic circuit as the first semiconductor circuit, and
the second semiconductor substrate is a second logic substrate including a second logic circuit as the second semiconductor circuit.

(10)
The solid-state imaging element according to any one of (1) to (7),
wherein the first semiconductor substrate is a first memory substrate including a first memory circuit as the first semiconductor circuit, and
the second semiconductor substrate is a second memory substrate including a second memory circuit as the second semiconductor circuit.

(11)
The solid-state imaging element according to any one of (1) to (7), further comprising
a third semiconductor substrate having a third semiconductor circuit on a third surface of the substrate,
wherein the third semiconductor substrate and the pixel substrate are joined to each other such that the third surface of the third semiconductor substrate and the one surface of the pixel substrate face each other,
the first semiconductor circuit and the third semiconductor circuit are connected to each other on the first surface side and the third surface side, opposite to the side facing the pixel substrate, and
the second semiconductor circuit and the third semiconductor circuit are connected to each other on the second surface side and the third surface side, opposite to the side facing the pixel substrate.

(12)
The solid-state imaging element according to (11), further comprising:
a first wiring line that connects the first semiconductor circuit and the third semiconductor circuit to each other; and
a second wiring line that connects the second semiconductor circuit and the third semiconductor circuit to each other,
wherein the first wiring line is disposed on the first semiconductor substrate and the third semiconductor substrate, and
the second wiring line is disposed on the second semiconductor substrate and the third semiconductor substrate.

(13)
The solid-state imaging element according to (11) or (12),
wherein the first semiconductor substrate is a logic substrate including a logic circuit as the first semiconductor circuit,
the second semiconductor substrate is a first memory substrate including a first memory circuit as the second semiconductor circuit, and the third semiconductor substrate is a second memory substrate including a second memory circuit as the third semiconductor circuit.

(14) The solid-state imaging element according to (5), further comprising:
a third semiconductor substrate having a third semiconductor circuit on a third surface of the substrate;
a first wiring line that connects the first semiconductor circuit and the third semiconductor circuit to each other on the first surface side and the third surface side, opposite to the side facing the pixel substrate; and
a second wiring line that connects the second semiconductor circuit and the third semiconductor circuit to each other on the second surface side and the third surface side, opposite to the side facing the pixel substrate,
wherein the third surface of the third semiconductor substrate and the one surface of the pixel substrate are joined to each other so as to face each other, and
the first wiring line and the second wiring line are disposed on the support substrate on a side opposite to the third semiconductor substrate.

REFERENCE SIGNS LIST 1, 1b, 1c, 2, 2i, 2j SOLID-STATE IMAGING ELEMENT
10 LOGIC SUBSTRATE
11 LOGIC CIRCUIT
12, 12a, 12h VIA
20 MEMORY SUBSTRATE
21 MEMORY CIRCUIT
22, 22a, 22h VIA
30 PIXEL SUBSTRATE
31 PIXEL CIRCUIT
DD, DDb, DD, DDh, DDi WIRING LINE
SSc, SSj SHIELD

The invention claimed is:

1. A solid-state imaging element, comprising:
a first semiconductor substrate that includes a first semiconductor circuit, wherein the first semiconductor circuit is on a first surface of the first semiconductor substrate;
a second semiconductor substrate that includes a second semiconductor circuit, wherein the second semiconductor circuit is on a first surface of the second semiconductor substrate;
a pixel substrate that includes a pixel circuit, wherein the pixel circuit is on a surface of the pixel substrate;
a joining surface at which the first semiconductor substrate and the second semiconductor substrate are joined to the pixel substrate, wherein
each of the first surface of the first semiconductor substrate and the first surface of the second semiconductor substrate faces the surface of the pixel substrate,
the first semiconductor circuit is connected to the second semiconductor circuit on a second surface of the first semiconductor substrate and a second surface of the second semiconductor substrate,
the second surface of the first semiconductor substrate is opposite to the first surface of the first semiconductor substrate, and
the second surface of the second semiconductor substrate is opposite to the first surface of the second semiconductor substrate;
a wiring line; and
a shield between the joining surface and the wiring line, wherein
the shield includes a first via and a second via,
an end of the first via is connected to the second surface of the first semiconductor substrate, and
an end of the second via is connected to the second surface of the second semiconductor substrate.

2. The solid-state imaging element according to claim 1, further comprising:
a third via that penetrates the first semiconductor substrate; and
a fourth via that penetrates the second semiconductor substrate, wherein
the wiring line is configured to connect the third via to the fourth via, and
the first semiconductor circuit is connected to the second semiconductor circuit through the third via, the fourth via, and the wiring line.

3. The solid-state imaging element according to claim 2, wherein the wiring line is on the first semiconductor substrate and the second semiconductor substrate.

4. The solid-state imaging element according to claim 2, further comprising a support substrate joined to the second surface of the first semiconductor substrate and the second surface of the second semiconductor substrate, wherein
each of the third via and the fourth via penetrates the support substrate, and
the wiring line is on the support substrate.

5. The solid-state imaging element according to claim 2, further comprising a wiring layer that includes the wiring line, wherein
the wiring layer corresponds to a redistribution layer, and fabrication of the wiring layer is based on a plating technique.

6. The solid-state imaging element according to claim 2, further comprising a wiring layer that includes the wiring line, wherein fabrication of the wiring layer is based on a photolithography technique and a dry etching technique.

7. The solid-state imaging element according to claim 1, wherein
the first semiconductor substrate is a logic substrate,
the first semiconductor circuit is a logic circuit,
the second semiconductor substrate is a memory substrate, and
the second semiconductor circuit is including a memory circuit.

8. The solid-state imaging element according to claim 1, wherein
the first semiconductor substrate is a first logic substrate,
the first semiconductor circuit is a first logic circuit,
the second semiconductor substrate is a second logic substrate, and
the second semiconductor circuit is a second logic circuit.

9. The solid-state imaging element according to claim 1, wherein
the first semiconductor substrate is a first memory substrate,
the first semiconductor circuit is a first memory circuit,
the second semiconductor substrate is a second memory substrate, and
the second semiconductor circuit is a second memory circuit.

10. The solid-state imaging element according to claim 1, further comprising a first memory substrate that includes a first memory circuit, wherein
the first memory substrate is joined to the pixel substrate,
the first semiconductor circuit is connected to the first memory circuit, and
the second semiconductor circuit is connected to the first memory circuit.

11. The solid-state imaging element according to claim 1, further comprising:
a first wiring line configured to connect the first semiconductor circuit with the pixel circuit; and
a second wiring line configured to connect the second semiconductor circuit with the pixel circuit, wherein
the first wiring line is on the first semiconductor substrate, and
the second wiring line is on the second semiconductor substrate.

12. The solid-state imaging element according to claim 10, wherein
the first semiconductor substrate is a logic substrate,
the first semiconductor circuit is a logic circuit,
the second semiconductor substrate is a second memory substrate, and
the second semiconductor circuit is second memory circuit.

13. The solid-state imaging element according to claim 4, further comprising:
a first wiring line configured to connect the first semiconductor circuit with the pixel circuit; and
a second wiring line configured to connect the second semiconductor circuit with the pixel circuit, wherein
the first wiring line is on the first surface of the first semiconductor substrate, and
the second wiring line is on the first surface of the second semiconductor substrate.

\* \* \* \* \*